United States Patent [19]

James

[11] Patent Number: 5,703,907
[45] Date of Patent: Dec. 30, 1997

[54] METHOD FOR DATA COMPRESSION

[75] Inventor: David C. James, Marco Island, Fla.

[73] Assignee: The James Group, Naples, Fla.

[21] Appl. No.: 650,119

[22] Filed: Jun. 3, 1996

Related U.S. Application Data

[62] Division of Ser. No. 30,741, Mar. 12, 1993, Pat. No. 5,533,051.

[51] Int. Cl.$^6$ ........................................... H04B 1/66
[52] U.S. Cl. ..................... 375/240; 341/55; 341/95; 341/106
[58] Field of Search ................. 375/240–242, 375/253, 245, 246; 370/118; 341/55, 95, 106, 200; 348/384, 405; 364/115.02; 380/42, 49; 382/244

[56] References Cited

U.S. PATENT DOCUMENTS

| | | | |
|---|---|---|---|
| 3,694,813 | 9/1972 | Loh et al. | 395/800 |
| 4,369,463 | 1/1983 | Anastassiou | 341/60 |
| 4,491,934 | 1/1985 | Heinz | 364/900 |
| 4,545,032 | 10/1985 | Mak | 364/900 |
| 4,560,976 | 12/1985 | Finn | 340/347 |
| 4,597,057 | 6/1986 | Snow | 364/900 |
| 4,633,490 | 12/1986 | Mitchell | 375/240 |
| 4,652,856 | 3/1987 | Mohiuddin | 341/60 |
| 4,672,539 | 6/1987 | Goertzel | 364/300 |
| 4,725,884 | 2/1988 | Gonzales | 348/79 |
| 4,748,577 | 5/1988 | Marchant | 364/722 |
| 4,749,983 | 6/1988 | Langdon | 341/51 |
| 4,782,325 | 11/1988 | Jeppsson et al. | 341/55 |
| 4,796,003 | 1/1989 | Bentley | 341/95 |
| 4,881,075 | 11/1989 | Weng | 341/87 |
| 4,905,297 | 2/1990 | Langdon | 382/247 |
| 4,906,991 | 3/1990 | Fiala et al. | 341/51 |
| 4,935,882 | 6/1990 | Pennebaker | 364/554 |
| 4,955,066 | 9/1990 | Notenboom | 382/56 |
| 4,973,961 | 11/1990 | Chamzas et al. | 341/51 |
| 5,025,258 | 6/1991 | Duttweiler | 341/107 |
| 5,043,728 | 8/1991 | Hoshi et al. | 341/106 |
| 5,051,745 | 9/1991 | Katz | 341/51 |
| 5,325,091 | 6/1994 | Kaplan et al. | 341/51 |
| 5,379,355 | 1/1995 | Allen | 382/56 |

Primary Examiner—Stephen Chin
Assistant Examiner—Amanda T. Le
Attorney, Agent, or Firm—Joseph V. Coppola, Sr.

[57] ABSTRACT

Methods for compressing data including methods for compressing highly randomized data are disclosed. Nibble encode, distribution encode, and direct bit encode methods are disclosed for compressing data which is not highly randomized. A randomized data compression routine is also disclosed and is very effective for compressing data which is highly randomized. All of the compression methods disclosed operate on a bit level and accordingly are insensitive to the nature or origination of the data sought to be compressed. Accordingly, the methods of the present invention are universally applicable to any form of data regardless of its source of origination.

4 Claims, 31 Drawing Sheets

```
EX: STRING$ ⇒ BYTE1 = 32₁₀     FIND APPROPRIATE WORD VALUE RANGE FROM TABLE OF
         BYTE2 = 255₁₀         FIG. 35 AND SELECT CORRESPONDING SUBTRAHEND;
         BYTE3 = 17₁₀       ⇒  SUBTRACT SUBTRAHEND FROM ASSOCIATED BYTE
         BYTE4 = 67₁₀
         BYTE5 = 203₁₀         BALANCE (B)   CONTROL WORD (CW)   RESOLVE BIT (R)   LENGTH IN BITS
                                7 6 5 4 3 2 1    8 6 5 4 3 2 1

CASE 3: EB1$ ⇒ BYTE1 - 32   ⇒   0 0 0 0 0          1 1                 1                8
CASE 1: EB2$ ⇒ BYTE2 - 128  ⇒   1 1 1 1 1 1 1      0                  X                8
CASE 4: EB3$ ⇒ BYTE3 - 16'  ⇒   0 0 0 1            1 0 1              1                8
CASE 2: EB4$ ⇒ BYTE4 - 64   ⇒   0 0 0 0 1 1        1                  0                8
CASE 1: EB5$ ⇒ BYTE5 - 128  ⇒   1 0 0 1 0 1 1      0                  X                8

BUILD B OUTPUT STRING$ (BOUTS$) = EB1$(B) / EB2$(B) / EB3$(B) / EB4$(B) / EB5$(B)
    BUILD CW/R OUTPUT STRING$ (CW/ROUTS$) = EB1$(CW) / EB2$(CW) / EB3$(CW) / EB4$(CW) / EB5$(CW) / EB5$(R) /
                                            EB4$(R) / EB3$(R) / EB2$(R) / EB1$(R)

BOUTS$ = 00000 / 1111111 / 0001 / 000011 / 1001011
               CW/ROUTS$ = 11 / 0 / 101 / 1 / 0 / X / 0 / 1 / X / 1

X = NO RESOLVE BIT NEEDED
```

| NIBBLE ENCODE METHOD | | | | | | | |
|---|---|---|---|---|---|---|---|
| VALUE OF A GIVEN NIBBLE \ STRING | STRING 1 $ | STRING 2 $ | STRING 3 $ | STRING 4 $ | STRING 5 $ | STRING 6 $ | STRING 7 $ |
| 0000 | 0 | 0 | 00 | X | X | X | X |
| 0001 | 0 | 0 | 10 | X | X | X | X |
| 0010 | 0 | 0 | 01 | X | X | X | X |
| 0011 | 0 | 0 | 11 | X | X | X | X |
| 0100 | 0 | 1 | 00 | X | X | X | X |
| 0101 | 0 | 1 | 10 | X | X | X | X |
| 0110 | 0 | 1 | 01 | X | X | X | X |
| 0111 | 0 | 1 | 11 | X | X | X | X |
| 1000 | 1 | X | 00 | 0 | 0 | X | X |
| 1001 | 1 | X | 10 | 0 | 0 | X | X |
| 1010 | 1 | X | 01 | 0 | 0 | X | X |
| 1011 | 1 | X | 11 | 0 | 0 | X | X |
| 1100 | 1 | X | X | 0 | 1 | X | X |
| 1101 | 1 | X | X | 1 | X | 1 | X |
| 1110 | 1 | X | X | 1 | X | 0 | 0 |
| 1111 | 1 | X | X | 1 | X | 0 | 1 |

X = NO CHANGE

| INPUT STRING / OUTPUT STRINGS | BYTE 1 NIBBLE 1 (0000) | BYTE 1 NIBBLE 2 (0001) | BYTE 2 NIBBLE 3 (0010) | BYTE 2 NIBBLE 4 (0011) | BYTE 3 NIBBLE 5 (0100) | BYTE 3 NIBBLE 6 (0101) | BYTE 4 NIBBLE 7 (0110) | BYTE 4 NIBBLE 8 (0111) | BYTE 5 NIBBLE 9 (1000) | BYTE 5 NIBBLE 10 (1001) | BYTE 6 NIBBLE 11 (1010) | BYTE 6 NIBBLE 12 (1011) | BYTE 7 NIBBLE 13 (1100) | BYTE 7 NIBBLE 14 (1101) | BYTE 8 NIBBLE 15 (1110) | BYTE 8 NIBBLE 16 (1111) |
|---|---|---|---|---|---|---|---|---|---|---|---|---|---|---|---|---|
| STRING1$ | 0 | 0 | 0 | 0 | 0 | 0 | 0 | 0 | 1 | 1 | 1 | 1 | 1 | 1 | 1 | 1 |
| STRING2$ | 0 | 0 | 0 | 0 | 1 | 1 | 1 | 1 | X | X | X | X | X | X | X | X |
| STRING3$ | 00 | 10 | 01 | 11 | 00 | 10 | 01 | 11 | 00 | 10 | 01 | 11 | X | X | X | X |
| STRING4$ | X | X | X | X | X | X | X | X | 0 | 0 | 0 | 0 | 1 | 1 | 1 | 1 |
| STRING5$ | X | X | X | X | X | X | X | X | 0 | 0 | X | X | 1 | 1 | 0 | X |
| STRING6$ | X | X | X | X | X | X | X | X | X | X | X | X | X | X | 0 | 0 |
| STRING7$ | X | X | X | X | X | X | X | X | X | X | X | X | X | X | X | 1 |

X = NO CHANGE

FIG.5B

| | TOTAL NUMBER OF BITS | RATIO OF ZERO'S TO TOTAL NUMBER OF BITS |
|---|---|---|
| | 64 | 50 % |
| | 16 | 50.0 % |
| | 8 | 50.0 % |
| | 24 | 50.0 % |
| | 8 | 62.5 % |
| | 5 | 80.0 % |
| | 3 | 66.6 % |
| | 2 | 50.0 % |
| | 64 | |

| ENCODE USING NIBBLE ENCODE METHODOLOGY OF FIG 4 ||||||
|---|---|---|---|---|---|
| OUTPUT STRINGS / INPUT STRING | | NIBBLE 1 0001 | NIBBLE 2 0010 | NIBBLE 3 0011 | NIBBLE 4 1110 |
| STRING1$ | | 0 | 0 | 0 | 1 |
| STRING2$ | | 0 | 0 | 0 | X |
| STRING3$ | | 10 | 01 | 11 | X |
| STRING4$ | | X | X | X | 1 |
| STRING5$ | | X | X | X | X |
| STRING6$ | | X | X | X | 0 |
| STRING7$ | | X | X | X | 0 |
| X = NO CHANGE ||||||

FIG. 7A

| DECODE NIBBLE 1 USING DECODE TREE OF FIG 6 ||
|---|---|
| OUTPUT STRINGS | BIT LOCATION<br>1 2 3 4 5 6 7 8 9 10 |
| STRING1$<br>STRING2$<br>STRING3$<br>STRING4$<br>STRING5$<br>STRING6$<br>STRING7$ | 0 0 0 1<br>0 0 0<br>1 0 0 1 1 1<br>1<br><br>0<br>0 |
| INPUT STRING = 0001 ||

FIG. 7B

| DECODE NIBBLE 2 USING DECODE TREE OF FIG 6 ||
|---|---|
| OUTPUT STRINGS | BIT LOCATION<br>1 2 3 4 5 6 7 8 9 10 |
| STRING1$<br>STRING2$<br>STRING3$<br>STRING4$<br>STRING5$<br>STRING6$<br>STRING7$ | 0 0 1<br>0 0<br>0 1 1 1<br>1<br><br>0<br>0 |
| INPUT STRING = 00010010 ||

FIG. 7C

| DECODE NIBBLE 3 USING DECODE TREE OF FIG 6 ||
|---|---|
| OUTPUT STRINGS | BIT LOCATION<br>1 2 3 4 5 6 7 8 9 10 |
| STRING1$<br>STRING2$<br>STRING3$<br>STRING4$<br>STRING5$<br>STRING6$<br>STRING7$ | 0 1<br>0<br>1 1<br>1<br><br>0<br>0 |
| INPUT STRING = 000100100011 ||

FIG. 7D

| DECODE NIBBLE 4 USING DECODE TREE OF FIG 6 ||
|---|---|
| OUTPUT STRINGS | BIT LOCATION<br>1 2 3 4 5 6 7 8 9 10 |
| STRING1$<br>STRING2$<br>STRING3$<br>STRING4$<br>STRING5$<br>STRING6$<br>STRING7$ | 1<br><br><br>1<br><br>0<br>0 |
| INPUT STRING = 0001001000111110 ||

FIG. 7E

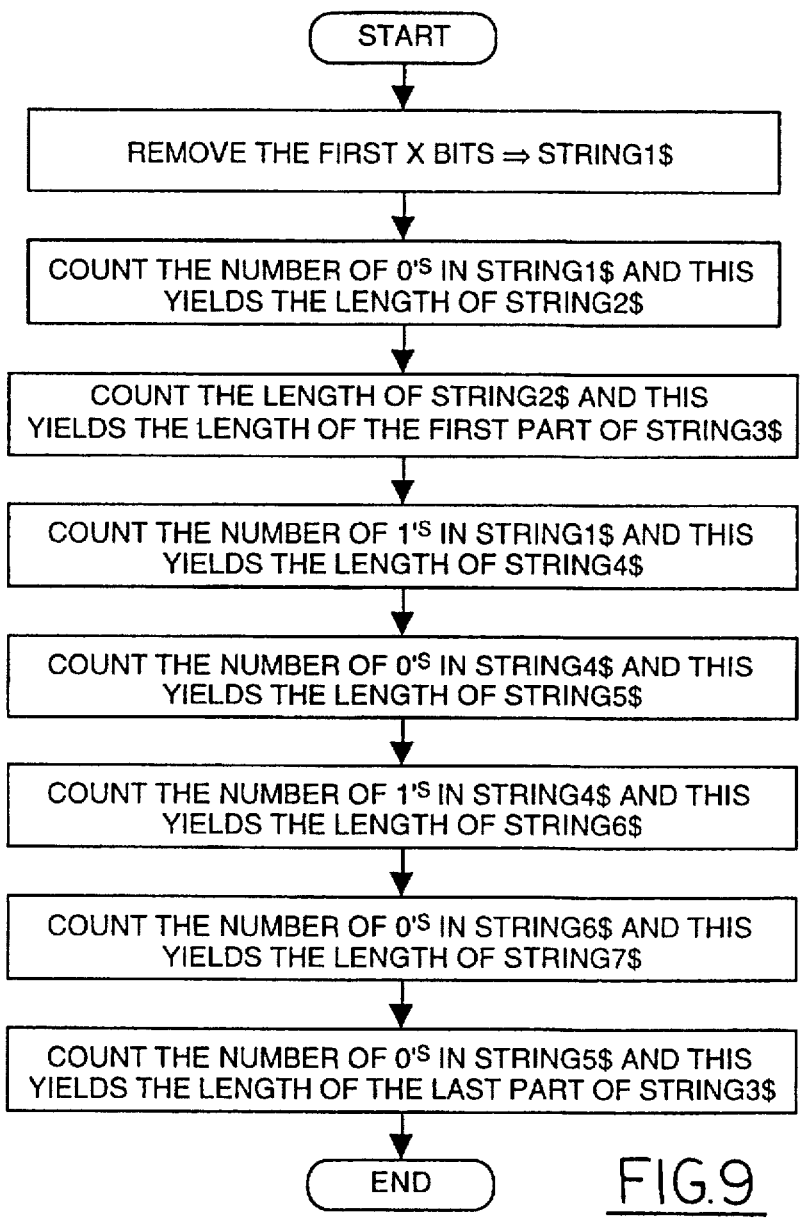

FIG.13A

| CONVERT USING CONVERSION METHODOLOGY OF TABLE 2 | |
|---|---|
| INPUT STRING$ | 0 0 1 0 1 0 0 0 1 0 0 0 1 0 0 0 0 0 1 0 |
| OUTPUT STRINGS | |
| TC1$ | 0 X X 0 X 0 X 0 0 X |
| TC2$ | 0 1 1 0 1 0 1 0 0 1 |
| TC3$ | X 0 0 X 0 X 0 X X 0 |
| X = NO CHANGE | |

FIG.13B

| DECODE USING DECODE TREE OF FIG 11 | |
|---|---|
| OUTPUT STRINGS | BIT LOCATION 1 2 3 4 5 6 7 8 9 10 |
| TC1$ | (0) 0 0 0 0 |
| TC2$ | (0) 1 1 0 1 0 1 0 0 1 |
| TC3$ | 0 0 0 0 0 |
| INPUT STRING = 00 | |

FIG.13C

| DECODE USING DECODE TREE OF FIG 11 | |
|---|---|
| OUTPUT STRINGS | BIT LOCATION 1 2 3 4 5 6 7 8 9 |
| TC1$ | 0 0 0 0 |
| TC2$ | (1) 1 0 1 0 1 0 0 1 |
| TC3$ | (0) 0 0 0 0 |
| INPUT STRING = 0010 | |

FIG.13D

| DECODE USING DECODE TREE OF FIG 11 | |
|---|---|
| OUTPUT STRINGS | BIT LOCATION 1 2 3 4 5 6 7 8 9 10 |
| TC1$ | 0 0 0 0 |
| TC2$ | (1) 0 1 0 1 0 0 1 |
| TC3$ | (0) 0 0 0 |
| INPUT STRING = 001010 | |

FIG.13E

| DECODE USING DECODE TREE OF FIG 11 | |
|---|---|
| OUTPUT STRINGS | BIT LOCATION 1 2 3 4 5 6 7 8 9 10 |
| TC1$ | (0) 0 0 0 |
| TC2$ | (0) 1 0 1 0 0 1 |
| TC3$ | 0 0 0 |
| INPUT STRING = 00101000 | |

FIG.13F

| DECODE USING DECODE TREE OF FIG 11 | |
|---|---|
| OUTPUT STRINGS | BIT LOCATION 1 2 3 4 5 6 7 8 9 10 |
| TC1$ | 0 0 0 |
| TC2$ | (1) 0 1 0 0 1 |
| TC3$ | (0) 0 0 |
| INPUT STRING = 0010100010 | |

FIG.16A

| ENCRYPT USING ENCRYPT ALGORITHM OF TABLE 4 | | | | | |
|---|---|---|---|---|---|
| OUTPUT STRINGS \ INPUT STRING | BIT LOCATION 1 2 3 4 5 6 7 8 9 10 | | | | |
| | 0 0 1 0 0 0 1 0 0 0 | | | | |
| TE1$ | 0 | 1 | 0 | 1 | 0 |
| TE2$ | X | 1 | X | 1 | X |
| TE3$ | X | X | X | X | X |
| X = NO CHANGE | | | | | |

FIG.16B

| DECODE USING DECODE TREE OF FIG 15 | |
|---|---|
| OUTPUT STRINGS | BIT LOCATION 1 2 3 4 5 6 7 8 9 10 |
| TE1$ | ⓪ 1 0 1 0 |
| TE2$ | 1 1 |
| TE3$ | |
| INPUT STRING = 00 | |

FIG.16C

| DECODE USING DECODE TREE OF FIG 15 | |
|---|---|
| OUTPUT STRINGS | BIT LOCATION 1 2 3 4 5 6 7 8 9 10 |
| TE1$ | ① 0 1 0 |
| TE2$ | ① 1 |
| TE3$ | |
| INPUT STRING = 0010 | |

FIG.16D

| DECODE USING DECODE TREE OF FIG 15 | |
|---|---|
| OUTPUT STRINGS | BIT LOCATION 1 2 3 4 5 6 7 8 9 10 |
| TE1$ | ⓪ 1 0 |
| TE2$ | 1 |
| TE3$ | |
| INPUT STRING = 001000 | |

FIG.16E

| DECODE USING DECODE TREE OF FIG 15 | |
|---|---|
| OUTPUT STRINGS | BIT LOCATION 1 2 3 4 5 6 7 8 9 10 |
| TE1$ | ① 0 |
| TE2$ | ① 1 |
| TE3$ | |
| INPUT STRING = 00100010 | |

FIG.16F

| DECODE USING DECODE TREE OF FIG 15 | |
|---|---|
| OUTPUT STRINGS | BIT LOCATION 1 2 3 4 5 6 7 8 9 10 |
| TE1$ | ⓪ |
| TE2$ | |
| TE3$ | |
| INPUT STRING = 0010001000 | |

FIG. 17A

0'S PREDOMINATE ROUTINE

| INPUT STRING STRING4$ | 4 | 8 | 12 | 16 | 20 | 24 | 28 | 32 | 36 | 40 |
|---|---|---|---|---|---|---|---|---|---|---|
| | 0010 | 1000 | 1000 | 1000 | 0010 | 0000 | 0001 | 1010 | 0000 | 0010 |
| OUTPUT STRINGS | | | | | | | | | | |
| TC1$ | o | x | x | x | x | o | o | o | x | x |
| TC2$ | o | 1 | 1 | 1 | 1 | o | o | 1 | o | 1 |
| TC3$ | x | o | o | o | o | x | x | o | x | o |

| 44 | 48 | 52 | 56 | 60 | 64 |
|---|---|---|---|---|---|
| 0000 | 0000 | 1000 | 0011 | 0000 | 0101 |
| o | o | x | o | o | x |
| o | o | 1 | o | o | 1 |
| x | x | o | x | x | 1 |

X = NO CHANGE

64 BITS − 64 BIT = 0 BITS REMOVED BY CONVERSION SCHEME

FIG. 17B

| | TOTAL NUMBER OF BITS IN STRING | RATIO OF ZERO BITS / TOTAL NUMBER OF BITS (I.E. ZERO BIT BIAS) |
|---|---|---|
| | → 64 BITS | 50/64 ⇒ .78125 |
| | → 20 BITS | 19/20 ⇒ .95000 |
| | → 32 BITS | 20/32 ⇒ .62500 |
| | → +12 BITS | 9/12 ⇒ .75000 |
| | 64 BITS | |

COMPRESSED LENGTH OF TC1$ = 6+1+1
= 8 BITS

TOTAL REDUCTION = 20-8
= 12 BITS

% REDUCTION = 12/20
= 60%

| RECURSION METHODOLOGY EMPLOYED BY THE ENCRYPTION SUBROUTINE ON TC1$ | | | RATIO OF ZERO BITS / TOTAL NUMBER OF BITS (I.E. ZERO BIT BAIS) |
|---|---|---|---|
| STRING TO BE ENCRYPTED (TC1$) | 0 0 0 0 0 0 0 0 0 0 0 0 0 0 0 0 0 1 0 0 | ← 20 BITS | 19/20 ⇒ .95000 |
| RESULTS FROM ENCRYPTION SUBROUTINE (TABLE 4) TE111$ TE211$ TE311$ X = NO CHANGE | 0 0 0 0 0 0 0 0 0 0 1 0 X X X X X X X X X X X X X X X X X X X X 20 BITS - 12 BITS = 8 BITS REMOVED IN FIRST PASS THROUGH ENCRYPTION SUBROUTINE | ↓ 10 BITS ↓ 1 BIT ↓ +1 BIT 12 BITS | 9/10 ⇒ 0.90000 1/1 ⇒ 1.00000 1/1 ⇒ 1.0000 |
| SEND TE111$ THROUGH ENCRYPTION SUBROUTINE (I.E. RECURSE TE111$) TE111$ | 0 0 0 0 0 0 0 0 1 0 | ↓ 10 BITS | 9/10 ⇒ .95000 |
| RESULTS FROM ENCRYPTION SUBROUTINE TE121$ TE221$ TE321$ X = NO CHANGE | 0 0 0 0 1 1 X X X X X X X X X X X X 10 BITS - 6 BITS = 4 BITS REMOVED IN SECOND PASS THROUGH ENCRYPTION SUBROUTINE | ↓ 5 BITS ↓ 1 BIT ↓ +0 BITS 6 BITS | 4/5 ⇒ 0.80000 0/1 ⇒ 0.0000 N/A |
| SEND TE121$ THROUGH ENCRYPTION SUBROUTINE (I.E. RECURSE TE121$) TE121$ | 0 0 0 0 1 | ↓ 5 BITS | 4/5 ⇒ 0.80000 |
| RESULTS FROM ENCRYPTION SUBROUTINE TE131$ TE231$ TE331$ X = NO CHANGE | 0 0 X X X X RESIDUE = "1" 5 BITS - 3 BITS = 2 BITS REMOVED IN THIRD PASS THROUGH ENCRYPTION SUBROUTINE | ↓ 2 BITS ↓ 0 BITS ↓ +1 BIT 3 BITS | 2/2 ⇒ 1.00000 N/A N/A TOTAL SAVING = 8 + 4 + 2 = 14 BITS |

FIG.20

FINAL LENGTH OF TC3$ = 6+1+2
= 9 BITS

TOTAL REDUCTION = 12-9
= 3 BITS

% REDUCTION = 3/12
= 25%

FIG.25

EXAMPLE OF SINGLE ENCRYPT

| INPUT STRING / OUTPUT STRING | ENCRYPT | TOTAL NUMBER OF BITS | TOTAL NUMBER OF "1"s | TOTAL NUMBER OF "0"s |
|---|---|---|---|---|
|  | 1 1 0 0 0 1 0 1 0 0 0 1 1 0 1 1 0 0 1 0 1 0 0 1 1 0 1 0 0 0 0 0 0 0 | 32 | 13 | 19 |
| TE1$ | 1 0 1 1 0 1 1 1 1 1 0 1 1 0 0 0 | 16 | 10 | 6 |
| TE2$ | 0 X 1 1 X 0 0 1 0 0 X 0 0 0 0 0 | 10 | 3 | 7 |
| TE3$ | 1 X X X 1 0 X 0 0 X 1 0 X X X X | 7 | 3 | 4 |

X = NO CHANGE     TE1$ / TE2$ / TE3$

OUTPUT STRING = 1011101111011000 / 0110010000 / 1100010

FIG.26

EXAMPLE OF CONVERT AND THEN SINGLE ENCRYPT

| INPUT STRING / CONVERT OUTPUT STRING | CONVERT | TOTAL NUMBER OF BITS | TOTAL NUMBER OF "1"s | TOTAL NUMBER OF "0"s |
|---|---|---|---|---|
|  | 1 1 0 0 0 1 0 1 0 0 0 1 1 0 1 1 0 0 1 0 1 0 0 1 1 0 1 0 0 0 0 0 0 0 | 32 | 13 | 19 |
| TC1$ | 1 0 X X 0 1 X X X X X 0 1 X 0 0 0 | 9 | 3 | 6 |
| TC2$ | 0 0 1 1 0 0 X X 1 1 1 1 0 0 1 0 | 16 | 7 | 9 |
| TC3$ | X X X 0 0 X X X 1 0 1 1 X X 1 X X X | 7 | 4 | 3 |

| INPUT STRING / ENCRYPT OUTPUT STRING | ENCRYPT TC1$ REMAINDER | | | |
|---|---|---|---|---|
| TC1$ | 1 0 0 1 0 1 0 0 → 0 | 9 | 3 | 6 |
| TE1$ | 1 1 1 0 | 4 | 3 | 1 |
| TE2$ | 1 0 0 X | 3 | 1 | 2 |
| TE3$ | X 0 0 X | 2 | 0 | 2 |

OUTPUT STRING = TC2$ / TC3$ / TE1$ / REMAINDER / TE2$ / TE3$

OUTPUT STRINGS = 0011001110011000 / 0010111 / 1110 / 0 / 100 / 00

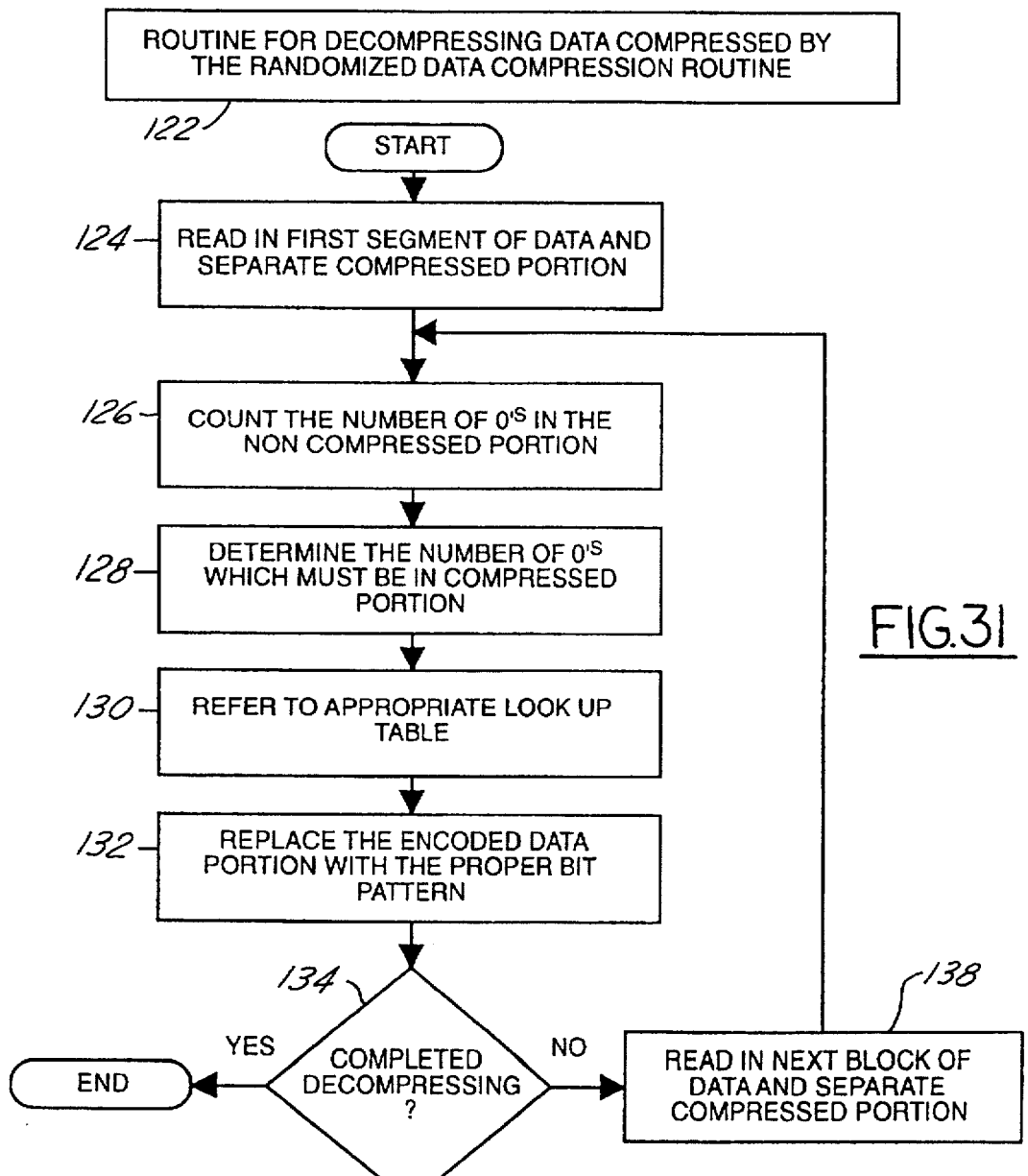

FIG. 33A

|  | NIBBLE 1 | NIBBLE 2 | NIBBLE 3 | NIBBLE 4 | NIBBLE 5 | ... | NIBBLE16 | CONT$ | POS$ |
|---|---|---|---|---|---|---|---|---|---|
| SEG 1 | 1101 | 1010 | 1010 | 0110 | 1000 | ... | 0010 | 0 | XXXX |
| SEG 2 | 0010 | 1110 | 1101 | 1001 | 0010 | ... | 1110 | 1 | 0010 |
| SEG 3 | 0110 | 0010 | 0000 | 1011 | 1110 | ... | 0111 | 1 | 0101 |
| ... | ... | ... | ... | ... | ... | ... | ... | ... | ... |
| SEG 99 | 1000 | 1110 | 0011 | 1100 | 1000 | ... | 1100 | 0 | XXXX |
| SEG 100 | 0111 | 1111 | 1011 | 0000 | 1000 | ... | 1110 | 1 | 1111 |

FIG. 33B

|  | NIBBLE 1 | NIBBLE 2 | NIBBLE 3 | NIBBLE 4 | NIBBLE 5 | ... | NIBBLE16 | CONT$ | POS$ | MPV$ |
|---|---|---|---|---|---|---|---|---|---|---|
| SEG 1 | 1101 | 1010 | 1010 | 0010 | 1000 | ... | 0010 | 0 | XXXX | XXXX |
| SEG 2 | 0010 | 1101 | 1001 | 0010 | 0010 | ... | XXXX | 1 | 0010 | 0010 |
| SEG 3 | 0110 | 0010 | 0000 | 1011 | 1000 | ... | XXXX | 1 | 0101 | 1000 |
| ... | ... | ... | ... | ... | ... | ... | ... | ... | ... | ... |
| SEG 99 | 1000 | 1110 | 0011 | 1100 | 1000 | ... | 1100 | 0 | XXXX | XXXX |
| SEG 100 | 0111 | 1111 | 1011 | 0000 | 1000 | ... | XXXX | 1 | 1111 | 1111 |

FIG. 34

{ OUTPUT STRING = MOD (TOTCONT$) / MOD (TOTMVP$) / PACKED BLK1 / PACKED PORTION OF BLK2 / PACKED PORTION OF BLK3; REMAINING PORTION OF BLK2 / REMAINING PORTION OF BLK3 / .... ...., PACKED BLK99 / PACKED PORTION OF BLK100; REMAINING PORTION OF BLK100

FIG. 35

DIRECT BIT ENCODE (1 BYTE WORDS)

| CASE | WORD VALUE RANGE | SUBTRAHEND | BALANCE | BITS NEED TO ENCODE | CONTROL WORD | ENCODE BITS + CONTROL WORD BITS | RESOLVE BIT | ENCODE BITS + CONTROL WORD + RESOLVE |
|---|---|---|---|---|---|---|---|---|
| 1 | 256 > > 127 | $2^8 \div 2 = 128$ | 0 - 127 | 7 | 0 | 8 | X | 8 |
| 2 | 128 > > 63 | $2^8 \div 4 = 64$ | 0 - 63 | 6 | 1 | 7 | 0 | 8 |
| 3 | 64 > > 31 | $2^8 \div 8 = 32$ | 0 - 31 | 5 | 11 | 7 | 1 | 8 |
| 4 | 32 > > 15 | $2^8 \div 16 = 16$ | 0 - 15 | 4 | 101 | 7 | 1 | 8 |
| 5 | 16 > > 7 | $2^8 \div 32 = 8$ | 0 - 7 | 3 | 1001 | 7 | 1 | 8 |
| 6 | 8 > > 3 | $2^8 \div 64 = 4$ | 0 - 3 | 2 | 10001 | 7 | 1 | 8 |
| 7 | 4 > > 1 | $2^8 \div 128 = 2$ | 0 - 1 | 1 | 100001 | 7 | 1 | 8 |
| 8 | 2 > > 0 | $2^8 \div 256 = 1$ | 0 | 0 | 1000001 | 7 | 1 | 8 |
| 9 | 0 | 0 | 0 | 0 | 10000001 | 8 | . | 9 |

X = NOT NEEDED

FIG. 36

EX: STRING$ ⇒ BYTE1 = 32₁₀    FIND APPROPRIATE WORD VALUE RANGE FROM TABLE OF
BYTE2 = 255₁₀   FIG. 35 AND SELECT CORRESPONDING SUBTRAHEND;
BYTE3 = 17₁₀  ⇒ SUBTRACT SUBTRAHEND FROM ASSOCIATED BYTE
BYTE4 = 67₁₀
BYTE5 = 203₁₀

```
              BALANCE (B)   CONTROL WORD (CW)   RESOLVE BIT (R)   LENGTH IN BITS
               7654321        8654321
CASE 3: EB1$ ⇒ BYTE1 - 32    00000      ⇒          11                 1              8
CASE 1: EB2$ ⇒ BYTE2 - 128   1111111    ⇒           0                 X              8
CASE 4: EB3$ ⇒ BYTE3 - 16    0001       ⇒         101                 1              8
CASE 2: EB4$ ⇒ BYTE4 - 64    000011     ⇒           1                 0              8
CASE 1: EB5$ ⇒ BYTE5 - 128   1001011    ⇒           0                 X              8
```

BUILD B OUTPUT STRING$ (BOUTS$) = EB1$(B) / EB2$(B) / EB3$(B) / EB4$(B) / EB5$(B)
BUILD CW/R OUTPUT STRING$ (CW/ROUTS$) = EB1$(CW) / EB2$(CW) / EB3$(CW) / EB4$(CW) / EB5$(R) /
                                        EB4$(R) / EB3$(R) / EB2$(R) / EB1$(R)

BOUTS$ = 00000 / 1111111 / 0001 / 000011 / 1001011
CW/ROUTS$ = 11 / 0 / 101 / 1 / 0 / X / 0 / 1 / X / 1

X = NO RESOLVE BIT NEEDED

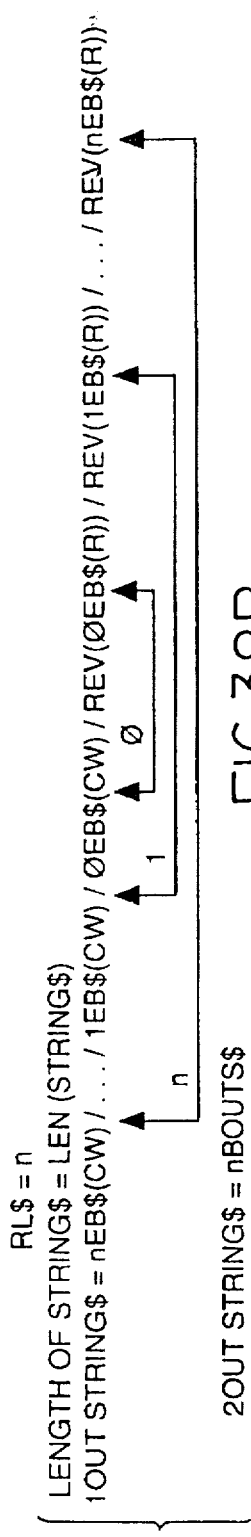

RL$ / LENGTH OF STRING$ / 2OUT STRING$ / 1 OUT STRING$ / 1 OUT STRING$

DIRECT BIT ENCODE (2 BYTE WORDS)

| CASE | WORD VALUE RANGE | SUBTRAHEND | BALANCE | NUMBER OF BITS NEEDED TO ENCODE BALANCE | CONTROL WORD | ENCODE BITS + CONTROL WORD BITS | RESOLVE BIT | ENCODE BITS + CONTROL WORD + RESOLVE |
|---|---|---|---|---|---|---|---|---|
| 1 | $2^{16} \div 1 >> (2^{16} \div 2) - 1$ | $2^{16} \div 2$ | $0 - (2^{16} \div 2) - 1$ | 15 | 0 | 16 | X | 16 |
| 2 | $2^{16} \div 2 >> (2^{16} \div 4) - 1$ | $2^{16} \div 4$ | $0 - (2^{16} \div 4) - 1$ | 14 | 1 | 15 | 0 | 16 |
| 3 | $2^{16} \div 4 >> (2^{16} \div 8) - 1$ | $2^{16} \div 8$ | $0 - (2^{16} \div 8) - 1$ | 13 | 11 | 15 | 1 | 16 |
| ... | ... | ... | ... | ... | ... | ... | ... | ... |
| 15 | $2^{16} \div 2^{14} >> (2^{16} \div 2^{15}) - 1$ | $2^{16} \div 2^{15}$ | $0 - (2^{16} \div 2^{15}) - 1$ | 1 | 1000000000000001 | 15 | 1 | 16 |
| 16 | $2^{16} \div 2^{15} >> (2^{16} \div 2^{16}) - 1$ | $2^{16} \div 2^{16}$ | 0 | 0 | 1000000000000001 | 15 | 1 | 16 |
| 17 | 0 | 0 | 0 | 0 | 1000000000000001 | 16 | 1 | 17 |

X = NOT NEEDED

METHOD FOR DATA COMPRESSION

RELATED APPLICATIONS

This application is a division of application Ser. No. 08/030,741 filed Mar. 12, 1993 now U.S. Pat. No. 5,533,051 issued Jul. 2, 1996.

TECHNICAL FIELD

The present invention generally relates to a method for compressing data, and more particularly relates to a method of operating a digital processing device for compressing data represented in digital form.

BACKGROUND OF THE INVENTION

Techniques for compressing data are commonly used in the communications and computer fields. In communications, it is often desirable to transmit compressed strings of data which, upon reception, can be reconstructed into their original form. Transmitting compressed data always takes less time than transmitting the same data in an uncompressed format. In the computer field, compressed data offers a storage advantage over non-compressed data. Thus, for a storage device having a fixed storage capacity, more files can be stored therein if they are first compressed. Accordingly, the two main advantages for compressing data are increased storage capacity and decreased transmission time.

Data compression techniques can be divided into two major categories: lossy and lossless. Lossless data compression techniques are employed when it is imperative that no information is lost in the compression/decompression process. Lossy data techniques are less accurate than lossless techniques but they generally are much faster. In short they sacrifice some accuracy for speed in the data compression/decompression cycle. Lossy data compression techniques are typically employed in those processing applications (such as the transmission and storage of digitized video and audio data) that can tolerate some information loss. Lossy data compression typically yield greater degrees of data compression and quicker compression processing than lossless data compression techniques. Lossy data compression techniques have recently gained substantial importance in view of the growing popularity of audio and video applications made available to personal computers and related markets. The vast majority of all other applications employ lossless data compression techniques for the compression of data.

By definition, lossless compression techniques employ methods that guarantee the precise duplication of data after it has passed through the compression/decompression cycle. Lossless compression is most commonly associated with storage of digital data used in conjunction with a computer. Such applications include the storage of data base records, spread sheet information, word processing files, etc.

At their very core, all data compression techniques are linked to, and employ a branch of mathematics known as Information Theory. This branch of mathematics concerns itself with questions regarding the expressing, storing, and communicating of information.

Data compression is linked to the field of Information Theory because of its concern with redundancy. If information in a data message is redundant (its omission does not reduce, in any way, the information encoded in the data) the message can be shortened without losing any portion of the information encoded therein. Thus lossless data compression reduces the size of the message without compromising the integrity of the information conveyed by the message.

Entropy is a term used to convey the measure of how much information is encoded in a message. A message having a high degree of entropy contains more information than a message of equal length having low entropy. The entropy of a symbol in a message is defined as the negative logarithm of its probability of occurrence in that message. To determine the information content of a character in bits, we express the entropy using base two logarithms as follows:

$$E_{char}(x) = -\log_2(\text{probability of char}(x))$$

where:

$E_{char}(x)$=Entropy of a given character in a message.

probability of char(x)=Probability of char(x) occurrence in that message.

The entropy of an entire message is simply the sum of the entropy of each character (or symbol) that is found in that message.

The concept of entropy guides us in our quest for optimizing data compression techniques because it, theoretically, determines how many bits of information are actually present in a message. If, in a given message, the character "Q" has a 1/16th probability of appearing, the information content carried by that character is 4 bits. The information content carried by a string of 2 "Qs" is 8 bits, etc. If we are using standard 8-bit ASCII characters to encode our "QQ" string, we need 16 bits. The difference between the 8 bits of entropy and the 16 bits used to encode our string is where the potential for data compression arises.

Entropy, as it is used in information theory, is only a relative measure of information content, and can never be an absolute measure. This is because the information content of a character is based on that character's probability of occurrence in a given message. For two different messages, both of which contain at least one occurrence of the letter "E", the probability of the occurrence of "E" will, most likely, differ between the two messages. Thus, the information content of the character "E" is not a fixed value but varies in value from message to message in proportion to its probability. Most data compression techniques focus on predicting symbols (or characters) within a given message that occur with high probabilities. A symbol that has a high probability, necessarily has a low information content and will require fewer bits to encode than low probability symbols. Different techniques are known for establishing the probability of a given character's occurrence. For textual data the simplest approach is to establish (empirically) the probability of each character's occurrence and assign a binary code to each character wherein the length of the binary code is inversely proportional to the character's probability of occurrence (i.e., shortest binary codes are assigned to the characters that appear with the highest frequency).

Dictionary based techniques use a slightly different approach in that a portion, or portions, of the data is first scanned to determine which characters, or character strings, occur most frequently. The characters, and character strings, are placed in a dictionary and assigned a predetermined code having a code length inversely proportional to the character's, or character string's, probability. The characters and character strings are read from the data file, matched up with their appropriate dictionary entry, and coded with the appropriate code.

Recently, data compression software has proliferated in the DOS community. This software suffers from a number of drawbacks. Firstly, programs are typically disc-intensive and consequently, their performance is tied closely to the speed with which one can read and write to the disc. For example, a popular computer compaction program known as PKZIP™ operating on a 25-MHZ 386 GATEWAY 2000™ with a hard disc having an 18 millisecond random access speed, takes 8.5 seconds to compress a 1-megabit ASCII file to ½ of its original size. Data base and spread sheet files take approximately the same amount of time, but they can be reduced by as much as two-thirds of their original size. Binary files shrink the least—generally between 10 and 40 percent of their original size—but require six times longer to compress than ASCII files of comparable length.

In view of the above deficiencies of known data compression methods, a need exists for more effective and more efficient data compression techniques.

It is believed that the present invention achieves levels of data compression which heretofore have never been accomplished. Known data compression products generally cannot obtain compression greater than 50 percent for text and graphic files and are even less successful (approximately 45 percent compression) on program execution files. With the present invention, data compression levels of 90 percent (and greater in certain applications) can be achieved in no more time than it takes presently available data compression products to compress the same data to 50 percent levels. The present invention achieves these high compression percentages by locating and separating ordered streams of information from what appears to be random (or chaotic) forms of information. Prior methods of data compression are largely unsuccessful in finding order (redundancy) within data which otherwise appears to be randomly arranged (without redundancy). Consequently, they are ineffective for compressing that which they cannot find.

As is well understood, once ordered forms of data are extracted from the random data, such ordered data can be easily compressed.

A second aspect of the present invention which further enhances its ability to achieve high compression percentages, is its ability to be applied to data recursively. Specifically, the methods of the present invention are able to make multiple passes over a file, each time further compressing the file. Thus, a series of recursions are repeated until the desired compression level is achieved.

SUMMARY OF THE INVENTION

In one aspect, the present invention provides a method of extracting redundancy from a stream of binary data. This method includes parsing a predetermined number of bits from the stream of data and determining the status of the parsed bits based on a plurality of possible statuses of the bits. Based on the status of the parsed bits a status code is associated with the status of the parsed bits. The status code is divided into first and second portions wherein the first portion is assigned to at least one of a first and third locations and the second portion is assigned to at least a second location.

In a second aspect, the present invention provides a method of compressing a stream of binary data. This method includes the steps of parsing a predetermined number of bits from a stream of binary data. For each parsed set of bits, the status of the bits is determined and a status code is placed in at least one of a first, second, and third locations. The coding of the status includes generating a plurality of variable length codes and dividing at least some of the plurality of codes into at least first and second portions. At least one of the codes or the code portions are assigned to at least one of the first, second, and third locations at least in part of the function of a desirable attribute associated with the n-bits of parsed data.

In a third aspect, the present invention discloses a method of repeatedly extracting and compressing redundant data from a stream of binary data. This method includes analyzing n-bits from the stream of data and classifying the occurrences of desirable n-bit patterns and undesirable n-bit patterns. A first code sequence is concatenated onto the contents of a first and second register for each occurrence of a desirable bit pattern and a second code sequence is concatenated onto the contents of the second register and a third register for each occurrence of an undesirable bit pattern. The contents of the first register are compressed and at least a portion of the compressed contents are, once again, operated upon by using the same methodology.

Yet in a fourth aspect, the present invention discloses a method of extracting and compressing redundant data from a stream of binary data. The method includes parsing a predetermined number of bits from the stream of data and determining the status of the parsed bits based on a plurality of possible statuses. The statuses are associated with a code and the codes are broken into portions. A first portion of the code is concatenated to the contents of at least one of a first and third register and a second portion of the code is concatenated into the contents of a second register. The contents of at least one of the first, second, and third registers. At least one of the first, second, and third registers is selected, and the contents of which, are parsed n-bits at a time. A code is assigned to each of the parsed n-bits of one of the registers said code value based, in part, upon the bit pattern of said bits parsed from said register contents. The code is divided into portions which are assigned to at least two of the first, second, and third registers.

Yet in an additional aspect, the present invention discloses a method of compressing data by use of a digital computer comprising the steps of: reading data from a source of data; converting the data into a useable format; encrypting the data to achieve a reduction in the total amount of data read from the source; storing the encrypted data; and reading the stored data and repeating the steps of converting, encrypting, and storing until such time and the stored data is reduced to a desired level.

Further still, the present invention discloses a method of extracting redundancy from a stream of binary data using a nibble encryption technique. This technique includes parsing nibbles from the stream of binary data and in response to the value of the nibbles parsed, concatenating one of a plurality of a control words to at least one of seven output strings.

Still in a seventh aspect, the present invention discloses a method of compressing data from a string of binary data using a distribution compression method. This method includes analyzing a stream of binary data to determine the most frequently occurring nibble value; dividing the stream of data into blocks of predetermined size; creating a first code string indicating which of the blocks contain the most frequently occurring nibble and which of the blocks do not; for those blocks which do not contain the most frequently occurring nibble, compressing their content using base 256 packing; for those blocks which do not contain the most frequently occurring nibble, creating a second code string which indicates where in each block the most frequently occurring nibble occurs; and compacting the first and second coded strings.

Still in an eighth aspect, the present invention discloses a method of compressing data from a stream of binary data using a direct bit manipulation method. This method involves providing the stream of binary data into a plurality of input words; defining a plurality of ranges; determining the range in which each of the words fall; converting each word into a balance value and assigning a control word and a resolve word to each balance value; wherein the balance value, control word, and resolve word uniquely define the value of their associated input word.

Still in a ninth aspect, the present invention discloses a method of compacting a stream of randomly distributed data. This aspect includes the steps of dividing the stream of data into a plurality of blocks of randomly distributed data; selecting one of the blocks of randomly distributed data; dividing the blocks selected into first and second portions; counting the occurrences of a predetermined word within the first portion of said block; and compressing the data in said second portion.

Still in a tenth aspect, the present invention discloses a method for creating from a stream of input data, coded, variable length strings that are easily packed and unpacked. This method includes the steps of parsing the stream of data n-bits at a time and coding the status of the parsed bits. At least some of the codes are divided into first and second portions and at least some of the first portions of the codes are placed into a second storage register and some of the second portions of some of the codes are placed into at least one of the first or the third storage registers. The values of the coded words and the placement of the portions of the coded words are chosen such that the number of occurrences of a first word value in the second storage register indicates the length of the contents of the first register.

Still in an eleventh aspect, the present invention discloses a method for portioning data into data strings that can be easily packaged. This method includes the steps of converting a stream of data into at least first and second data strings and encoding the first string of the data to contain at least a first code word. The length of the second string of data is indicated by the number of occurrences of the first code word within the first string.

Other advantages and meritorious features of the present invention will become more fully understood from the following description of the preferred embodiments, the appended claims, and the drawings, a brief description of which follows.

BRIEF DESCRIPTION OF THE DRAWINGS

FIG. 4 is a table embodying the nibble encode method of the present invention.

FIG. 5A and 5B illustrate the application of the table of FIG. 4 to a predetermined input string.

FIG. 7A is a table illustrating encoding of an input string using the nibble encode methodology of FIG. 4.

FIGS. 7B–7E are tables showing decoding the input string of FIG. 7A using the decode tree of FIG. 6.

FIG. 8 depicts the string package sequence used for packaging strings encoded by the nibble encode methodology.

FIG. 9 is a flow diagram for decoding the string package sequence depicted in FIG. 8.

FIG. 13A is a table illustrating an application of converting an input string using the conversion methodology of Table 2.

FIGS. 13B–13G are tables illustrating decoding the input string of 13A using the decode tree of FIG. 11.

FIG. 16A is a table illustrating encrypting an input string using the encrypt algorithm of Table 4.

FIGS. 16B–16F are tables illustrating decoding an input string using the decode tree of FIG. 15.

FIGS. 17A and 17B depict a table showing the application of the zero's predominate routine to a predetermined input string.

FIG. 20 is a tabular presentation of the graphical method of FIG. 19.

FIG. 25 is a tabular presentation of the operation of the encrypt algorithm of Table 4 on a predetermined input string.

FIG. 26 is a tabular presentation of the application of the convert/encrypt algorithm on string TC1$.

FIGS. 30A and 30B are exemplary look-up tables used in conjunction with the method of FIG. 29.

FIG. 31 is a flow diagram for a routine for decompressing data which has been compressed by the routine of FIG. 29.

FIGS. 33A and 33B are tables depicting the application of the method of FIG. 32 on a predetermined input string.

FIG. 34 is a string package sequence used for packaging strings created by the distribution encode method of FIG. 32.

FIG. 35 is a tabular representation of the direct bit encode method of the present invention.

FIG. 36 is an illustration of the application of the direct bit encode method of FIG. 35 as it is applied to five predetermined bit values.

FIGS. 38A–38C depict a method of building strings of data recursed by direct bit manipulation method.

FIG. 39 is a second embodiment of the direct bit encode method as it is applied to word values which are 2 Bytes long.

DETAILED DESCRIPTION OF THE PREFERRED EMBODIMENTS

Figure 1:
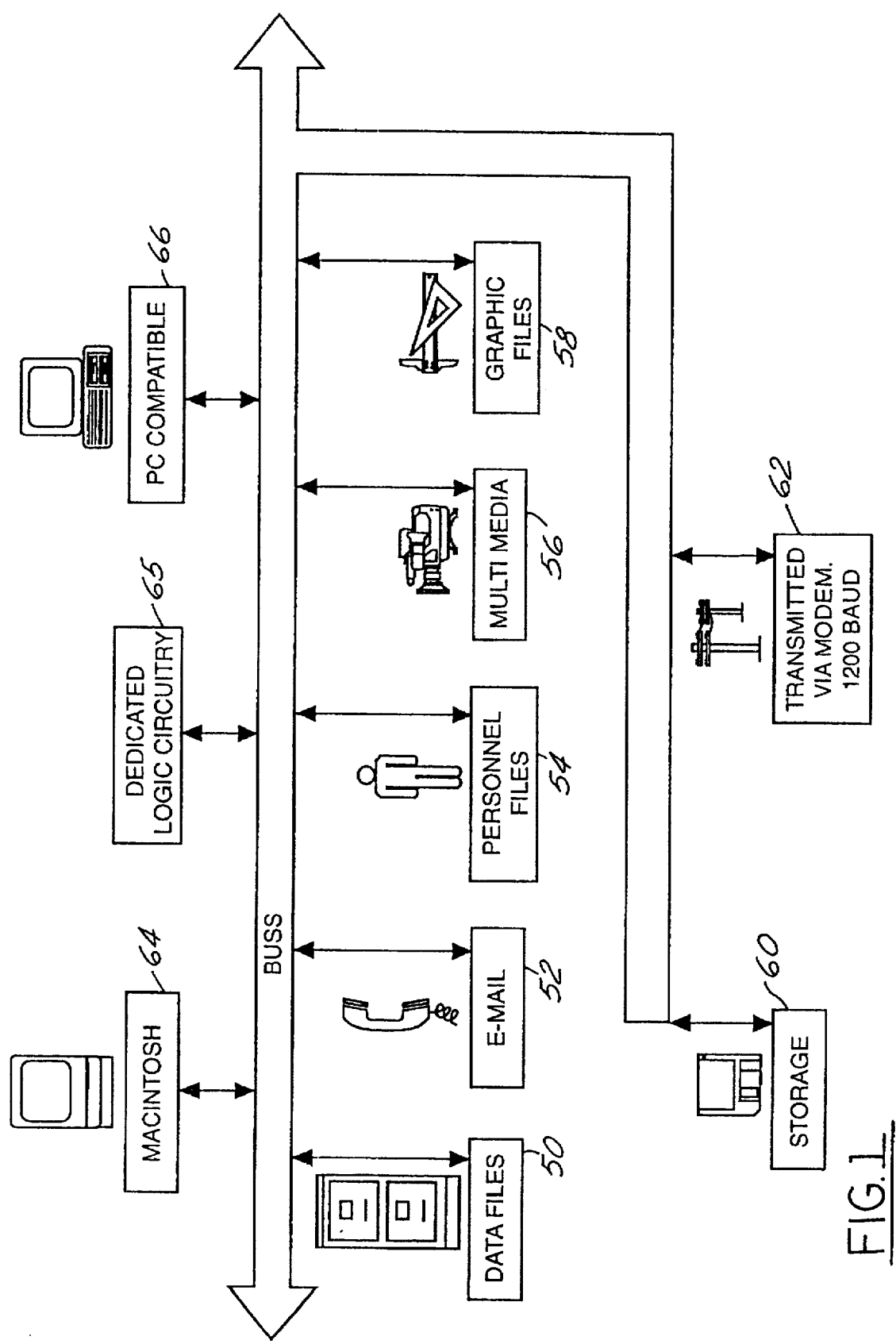
FIG. 1 is a diagrammatic drawing of sources which are capable of generating digital data.

The following definitions will apply for purposes of disclosing the present invention.

Definitions

"BIAS" The measure of the number of ones in a collection of binary data as compared to the number of zeros in the same collection. Such a measure is commonly expressed as a ratio. For example, if a given collection of binary data contains one 0 for every 1, it is said to be evenly biased (i.e., 50 percent biased). If a string contains more zeros than ones it is zero biased.

"BIGIT" A place holder in the binary number system. For example, a byte is a binary number having a length of 8 bigits. A bigit is analogous to a digit in the base 10 number system.

"BIT" A contraction of Binary digIT; a digit in the binary number system represented by a zero or a one; synonymous with bigit.

"BYTE" An 8 bigit binary number.

"ENTROPY" The measure of order in a system. In the context of information theory, it is the measure of the amount of information contained in a given message. The concept of "absolute entropy" remains elusive. The higher the likelihood of occurrence of certain symbols (or groups of symbols) in a message, the lower the entropy of such symbols.

"ENTROPY OF A CHARACTER" The entropy of a character is defined as the negative logarithm of its probability of occurrence. To determine the information content of a character in the binary number system, we express its entropy using the base 2 logarithm:

number of bits=−Logbase 2(probability)

The entropy of an entire message is simply the sum of the entropy of each individual character within that message. For example, if the probability of the character "e" appearing in this specification is 1/16, the information content of the character is 4 bits. So, if the character string "eeeee" appears, it has a total information content of 20 bits (the probability of each character summed for all characters).

"ENTROPY LIMIT" The theoretical minimum size below which a given collection of data cannot be reduced without incurring loss of information.

"EVENLY DISTRIBUTED DATA" Evenly distributed data is synonymous with randomly distributed data. In data which is randomly distributed, each character found in the character set appears equally as frequent in the message as any other character within the character set.

"nCr" The mathematical expression used to designate the number of possible combinations of n elements taken r at a time. Mathematically, nCr equals:

$$nCr = \frac{n!}{r!(n-r)!}$$

wherein:

n, r=number of things taken r at a time.

!=factorial operator

Example: How many different 8 bit patterns can be generated if 3 of the 8 bits are ones and 5 of the 8 bits are zeros?

Answer:

$$8C3 = \frac{8!}{3!(8-3)!} = 56$$

"NIBBLE" A four bigit binary number.

"PACK ROUTINE" A software routine used to combine two or more items (or number values) into one word to reduce the space needed to store the items or values. One such known routine is the PACKED DECIMAL routine. A sample pack routine is set forth below.

Example: When using a pack routine, a "base value" must be defined. The base value is always equal to one larger than the largest occurring value to be packed. For example, if we wish to pack the following three nibbles:

N1=1011

N2=0001

N3=0111 a base value of 12 must be established inasmuch as 12 is one greater than the highest occurring nibble value. Thus:

$$BASE = 11_{10} + 1_{10} = 12_{10} \Rightarrow (1100)_2$$

PACKED N1, N2, N3 = N1 * BASE$^2$ + N2 * BASE + N3
= (1011)(1100)$^2$ + (0001)(1100) + (0111)
= (1100011000) + (0001)(1100) + (0111)
= (11001000011)

LENGTH OF PACKED N1 + N2 + N3 = 11 BITS
LENGTH OF UNPACKED N1 + N2 + N3 = 12 BITS
  SAVINGS = 12 − 11 BIT
         = 1 BIT

N1, N2, and N3 are unpacked using the following scheme:

$$\text{UNPACK N1} = INT\frac{\text{PACKED N1, N2, N3}}{(BASE)^2} = INT\frac{(11001000011)}{(1100)^2}$$

= INT [1011.00100001]
= 1011

$$\text{UNPACK N2} = INT\frac{\text{PACKED N1, N2, N3} - (N1)(BASE)^2}{(BASE)}$$

$$= INT\frac{(11001000011) - 11000110000}{1100}$$

= INT [0001.100101]

|        | -continued |
|--------|------------|
| =      | 0001 |
| UNPACK N3 = | [PACKED N1, N2, N3 − (N1)(BASE)$^2$] − [(N$^2$)(BASE)] |
| =      | [(11001000011) − (11000110000)] − [(0001)(1100)] |
| =      | 0111 |

Now referring to FIG. 1, the method of the present invention is suitable for compacting all forms of digitally encoded information. Because the disclosed methods operate by focusing on patterns of binary data, they are insensitive to characteristics of the source of data. Accordingly, the methods of the present invention work equally well on data which originated as data files 50 which were stored on a digital storage medium, signals which originated as, or will be used to, synthesize voice information 52, other forms of digitally stored information 54, multi-media, or graphic files 56, 58, respectively. Likewise, the method of the present invention will handle information derived from any type of digital storage device 60 or digital information which was transmitted via a modem 62. The methods of the present invention are well suited to operate on any form of digital processing device such as a Macintosh® 64, a PCT compatible 66 or any other digital processing device. The methods of the present invention can also be implemented using dedicated logic circuitry 65. The present invention is effective for use in such a diverse manner because of its insensitivity to the original nature of the data. In short, any data that can be represented in binary form, the compression methods of the present invention are effective for reducing the size of the data without losing any information.

Figure 2:
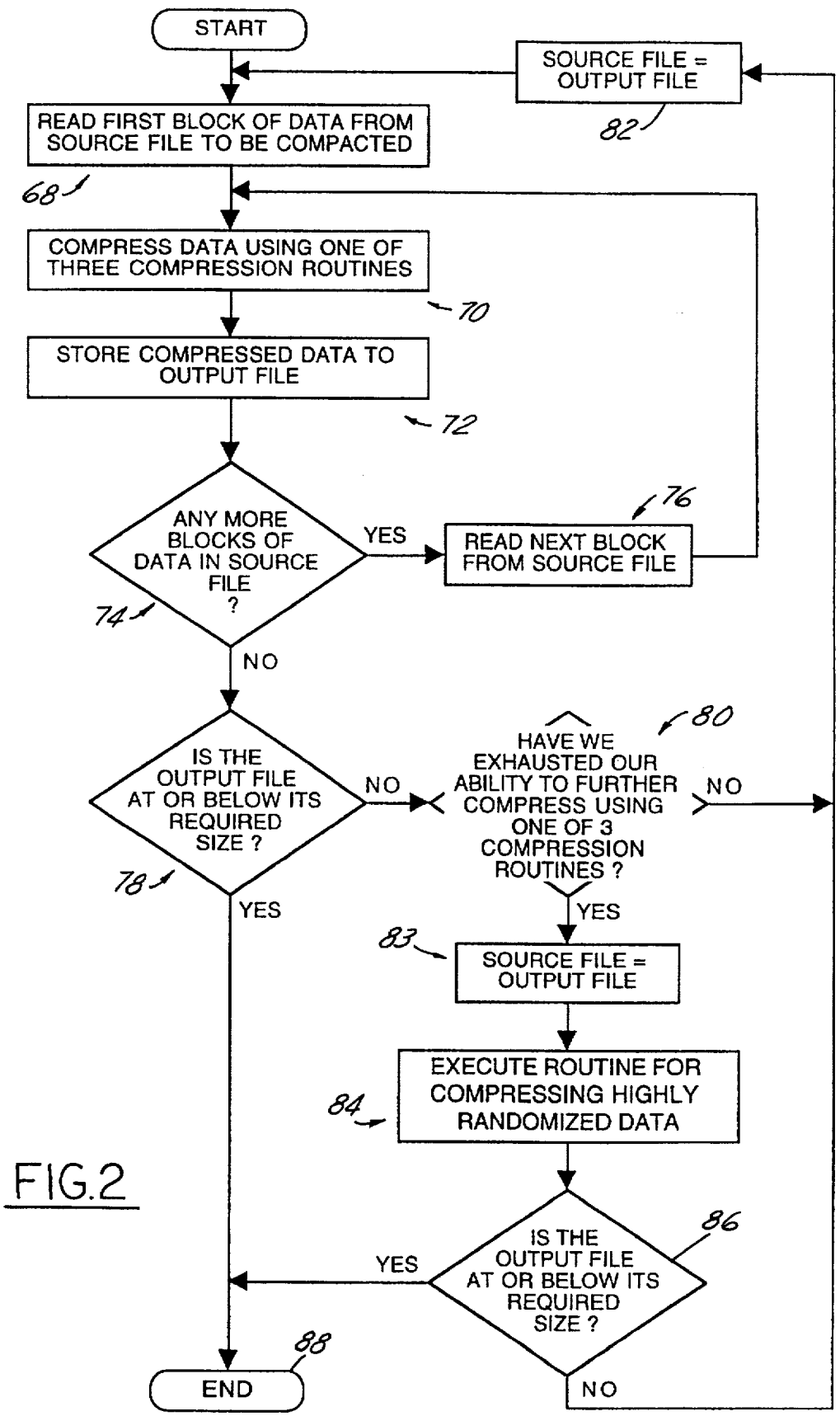
FIG. 2 is a general flow diagram showing the compression methods of the present invention.

Now referring to FIG. 2, at a general level, all of the compression methods disclosed herein follow the flow chart of FIG. 2. First, a source of data to be compressed (or compacted) is located and a first block of that data is read in from the source of data 68. The first block of data is compressed 70 using one of three compression routines hereinafter disclosed. The compressed data is stored 72 and if any additional blocks of data exist 74 they are retrieved 76 and processed through steps 70 and 72. If there are no more blocks of data in the source of data to be compressed, the compressed data file is examined 78 to determine if it is at or below the required size. If further data compression is necessary a check is made to determine if further use of one of the three compression routines is likely to produce further compression 80. If it is determined that further compression is possible using one of the three compression routines, the output file is redefined as the source file 82 and is sent through process steps 68 through 74 once again. This recursion process repeats until the output file is at or below its required size 78 or until it is deemed that any further recursion of the data is fruitless 80. If, after multiple recursions, one of the three compression routines are not capable of further compressing the size of the data file, the compressed output file is assigned to the source file 83 wherein a fourth data compression routine 84 operates on the data. After the fourth data compaction routine 84 operates on the data, the resulting data is checked to determine if it is at or below the required size 86. If so, the process ends 88. If the data requires further compaction it is again sent through step 82 where the source file is set equal to the output file and again sent through process steps 70 through 76 and if necessary recursed in accordance with steps 78 through 86.

Notwithstanding, the above broad description of the present invention, details of which will follow, it is important to note that a key and powerful feature of all of the compression methodologies disclosed herein relate to the recursive nature in which they operate. The recursive nature of the disclosed methodologies allow them to operate in any number of passes over the data to be compressed. Effectively, this allows the compression methodologies of the present invention to compress data which was "missed" in a previous pass. This recursive feature makes the disclosed methodologies highly efficient in locating and compressing redundant information.

A major characteristic differentiates the three compression routines of block 70 and the compression routine of block 84. The three compression routines set out in block 70 are effective for compressing input data which is moderately randomized. However, with each recursion, the methods of block 70 tend to shift the randomness of the compressed data to higher and higher levels. Thus, the compression methods of block 70 will, after multiple recursions, be inefficient at further reducing the size of the source file. Thus, there is a need for the compression method of block 84 which is effective for compressing highly entropic data.

The determination made in block 80 can, in part, be based upon the degree of success of previous recursions. For example, the history of the last five recursions can be logged reflecting the degree of data compaction which took place in each of the last five passes through the source file. If it appears that sufficient progress is still being made, there is no need to execute routine 84. However, if acceptable compression is no longer being achieved, the method of block 84 is executed.

One important aspect of the method of block 84 is its ability to compress highly entropic data. After making a pass through the source file using the method of block 84, it is highly likely that the resulting output file will no longer be entropic. If this is the case, sending it back through one of three compression method 70 will likely result in further compression. If it is not the case, the method of block 84 is capable of recursing its own output.

Figure 3A:
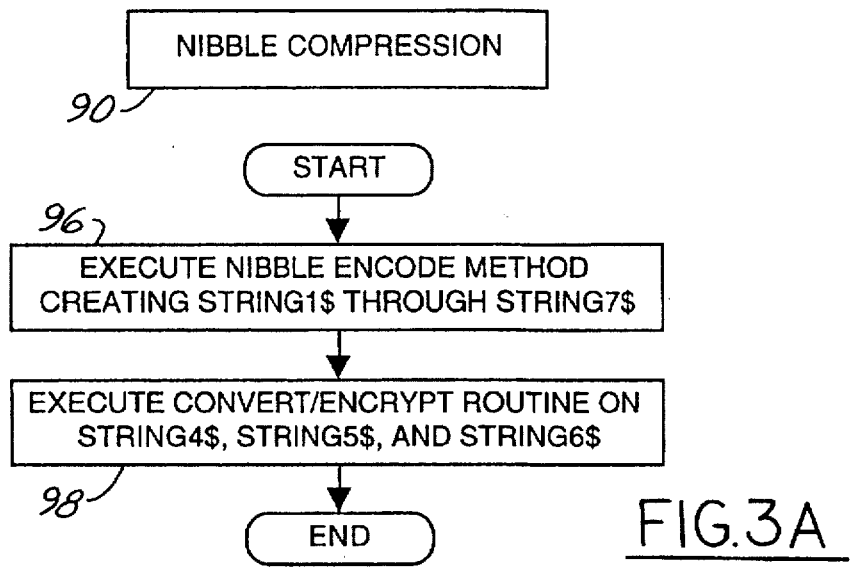
FIG. 3A is a general flow diagram showing the nibble compression program of the present invention.
Figure 3B:
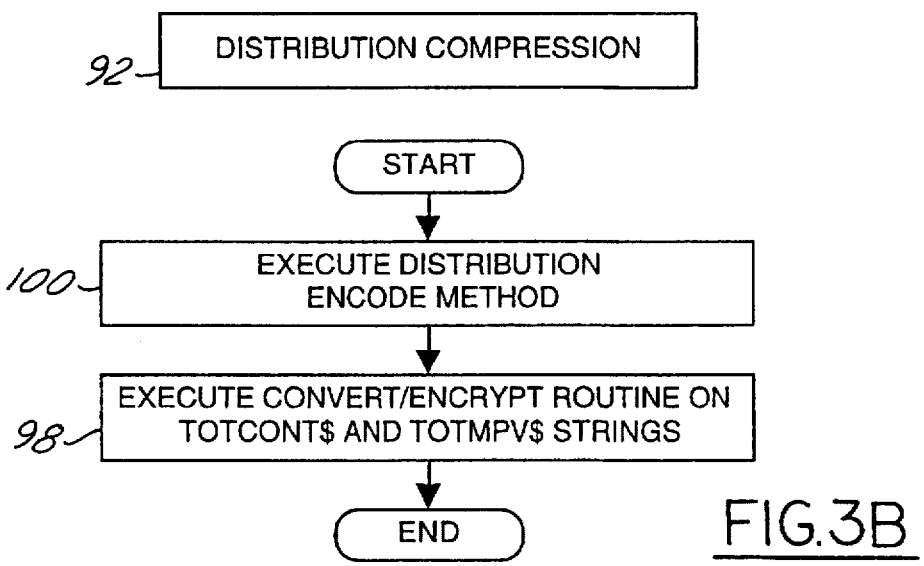
FIG. 3B is a general flow diagram showing the distribution compression program of the present invention.
Figure 3C:
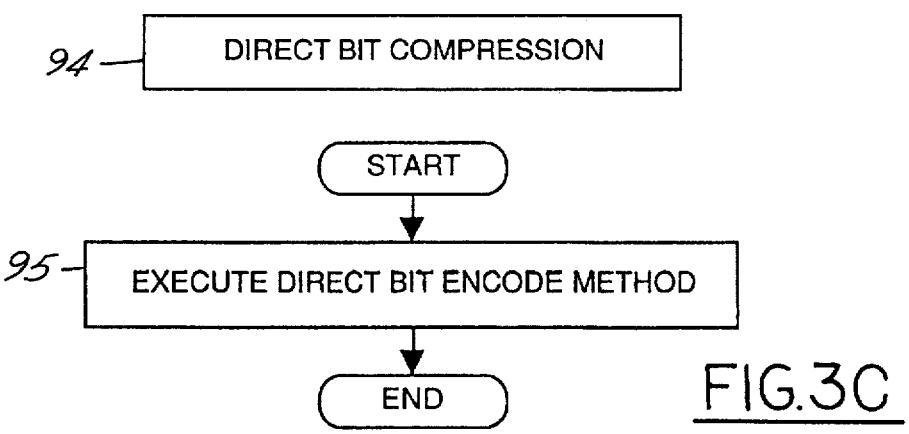
FIG. 3C is a general flow diagram showing the direct bit compression program of the present invention.

Now referring to FIGS. 3A, 3B and 3C. The three compression methods referred to in block 70 of FIG. 2 include nibble compression 90, distribution compression 92, and direct bit compression 94. Nibble encryption 90 and distribution compression 92 operate in a similar way inasmuch as they both use an encoding method to create uneven bias in select strings of data. After building strings of data, the biased strings are passed to the convert/encrypt routine 98 which forms the heart of the compression "engine" for nibble compression 90 and distribution compression 92. To set up the biased data, nibble compression 90 uses nibble encode method 96 to create seven strings of data— STRING1$ through STRING7$. In contrast, distribution compression 92 uses distribution encode method 100 to create two biased strings of information—TOTCONT$ and TOTMPV$. Direct bit compression 94 uses a methodology uncommon to nibble encryption 90 or distribution compression 92.

The description of the disclosed compression methodologies will be set forth as follows. The three compression routines set forth in block 70 of FIG. 2 will be explained in the following order—nibble compression 90, distribution compression 92, and direct bit compression 94. The randomized data compression routine of block 84 will be explained in conjunction with its interaction with each of the three methodologies 90, 92, 94.

1. Nibble Compression

Now referring to FIG. 2, 3A, 4, nibble encode method 96 can best be explained in conjunction with the table of FIG. 4. The first step implemented by the nibble encode methodology of the present invention is to read the first block of data 68 and parse it on a nibble by nibble basis. Depending on the value of each nibble, concatenate one or more predefined control words (bit or bit strings) onto the contents of at least one of STRING1$, STRING2$, STRING3$, ... STRING7$. Thus, for example, in reference to FIG. 4, if the first nibble from the input file has a value of 3, (i.e., binary=0011), strings STRING1$ and STRING2$ have a zero character concatenated onto their existing contents, STRING3$ has a "11" character appended onto its existing contents, and STRING4$, STRING5$, STRING6$, and STRING7$ are unaltered from their existing condition. Thus, strings STRING1$ through STRING7$ are continually built up for each nibble parsed from the input data string. To more clearly illustrate the goal sought to be achieved by nibble encode method 96 reference is now made to FIGS. 5A and 5B.

FIGS. 5A and 5B represent strings STRING1$ through STRING7$ as they would look if the input string of 16 nibbles (shown across the top of FIGS. 5A and 5B) were operated on by the nibble encode methodology set out in the table of FIG. 4. FIGS. 5A and 5B show that for the hypothetical input string set out therein having 64 bits and a bias of 50 percent (equal distribution), strings STRING1$, STRING2$, STRING3$, and STRING7$ will also share a 50/50 ratio of ones to zeros. However, strings STRING4$, STRING5$, and STRING6$ are offset, in various degrees, from the 50 percent bias of the original input string. If 50 percent bias in the input string is synonymous with no redundancy, the input string (set forth in FIGS. 5A and 5B) cannot be reduced beyond 64 bits. Although the nibble encode methodology did not reduce the number of bits, it did create three strings none of which are evenly biased. When each of these three strings are sent to convert/encrypt routine 98, routine 98 is able to reduce the length of each one of these strings thereby compressing the data. The ability of the nibble encode methodology to create strings of biased data from an input string of non-biased data is a key feature of the present invention. It is readily seen from the column in FIG. 5B entitled "TOTAL NUMBER OF BITS," that nibble encode method 96 does not result in a reduction in the total number of bits. For example, FIG. 5A and 5B illustrate that for nibble encryption 96 requires 66 bits to encode 16 nibbles ranging in value from 0 to 15. It takes 64 bits to encode these same 16 nibble values in straight binary format. As a result, using nibble encode, actually costs 2 bits to encode the input string of FIGS. 5A and 5B. However, because strings STRING4$, STRING5$, and STRING6$ will be biased (for an input stream of evenly distributed data), a theoretical savings of 2.19, 2.67, and 1.41 bits respectively can be gained. The calculations supporting this tabulation are set out below in Table 1.

TABLE 1

| STRING | $nCr = \frac{n!}{n!(n-r)!}$ | Number of bits needed to encode nCr | Original string length (bits) | Savings (bits) |
|---|---|---|---|---|
| STRING4$ | 8C3 = 56 | 5.81 | 8 | 2.19 |
| STRING5$ | 5C1 = 5 | 2.33 | 5 | 2.67 |
| STRING6$ | 3C1 = 3 | 1.59 | 3 | 1.41 |

| | |
|---|---|
| Total length of input string = | 64.00 bits |
| Total length of output strings = | 66.00 bits |
| Less total savings => 2.19 + 2.67 + 1.41 = | 6.27 bits |
| | 59.73 bits |

TABLE 1-continued

Savings over straight binary coding =

$$64 - 59.73 = 4.27 \text{ bits or } \frac{4.27}{64} = 6.67\%$$

Thus, once strings STRING4$, STRING4$, and STRING6$ are sent through convert/encrypt methodology 98 the effective compression achieved by nibble compression 90 will approach 6.67 percent. Of course, this does not take into account any overhead registers or other "housekeeping" type information which must be tracked. However, such overhead tends to be negligible when processing the large quantities of data typically encountered in data compression applications.

Two important features of nibble encode method 96 involve the ease in which strings STRING1$ through STRING7$ can be packed and unpacked and also the ease in which an original input string can be decoded from these seven coded output strings. These two features will now be discussed.

Decoding Strings Encoded By Nibble Encode Method

Figure 6:
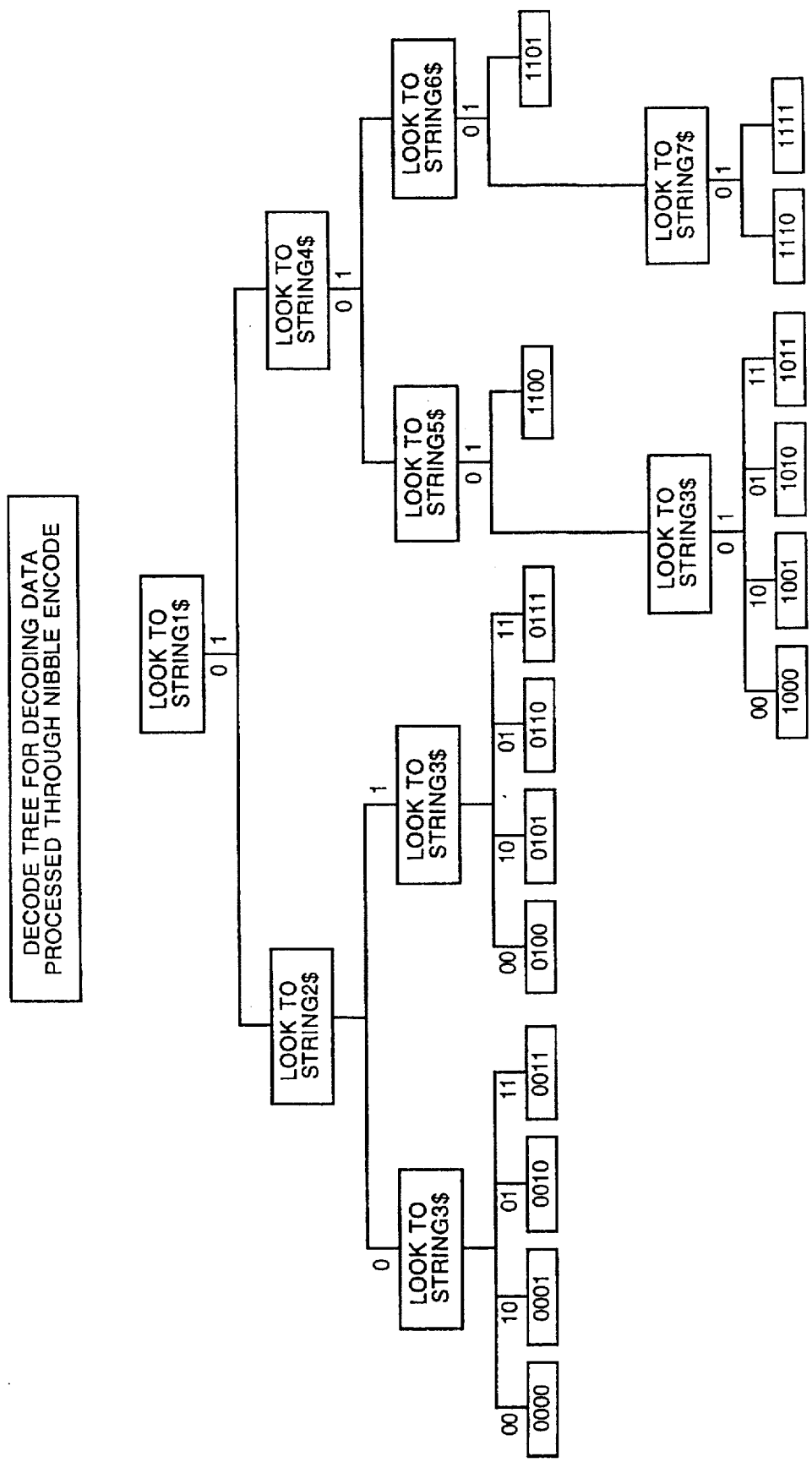
FIG. 6 is a flow diagram depicting a decode tree for decoding data processed through the nibble encode method of the present invention.

Now referring to FIG. 5A, 5B, and 6, reconstructing an input string which has been processed through nibble encode methodology 96 is accomplished by following the procedure set out in the decode tree of FIG. 6. An example of how the decode tree of FIG. 6 is used is set out in FIG. 7A through 7E. In FIG. 7A, the nibble encode methodology of FIG. 4 is applied to an input string of four nibbles. This results in building strings STRING1$ through STRING7$ as shown in FIG. 7A. Thereafter, the process set out in the decode tree of FIG. 6 is applied to the first bit of strings STRING1$ and STRING2$ and to the first two bits of STRING3$ (see FIG. 7B). The resultant bit sequence indicates that the first nibble in the original input string equals "0001". This agrees with the value of nibble 1 set out in FIG. 7A. These four bits of string STRING1$, STRING2$, and STRING3$ are discarded and the associated right most bits are all shifted leftward the appropriate amount and the process is repeated. FIGS. 7, 7D, and 7E indicate how Nibbles 2, 3, and 4 of the original input string are accurately reconstructed using the decode tree of FIG. 6.

Nibble Encode String Package Sequence

Because of the unique manner in which the seven strings are encoded by nibble encode method 96, they are easily identified if they are packaged together in the appropriate sequence. This sequence is layed out in FIG. 8.

Now referring to FIG. 8, if the seven strings generated by nibble encode method 96 are concatenated in the manner set out in FIG. 8, they are easily separable. The algorithm for separating such a concatenation of strings is set forth in FIG. 9. Now referring to FIGS. 8 and 9, to separate the concatenated strings of FIG. 8, the number of bits in the original input string must be known, or in turn, the original length of STRING1$ must be known. This is the only information which must be stored outside the concatenated string in order to separate out its component parts. As set out in FIG. 9, knowing the number of bits in STRING1$ allows us to strip it away from the concatenated string. A count of the number of zeros in string STRING1$ yields the length of STRING2$. The length of STRING2$ yields the length of the first part of STRING3$. A count of the number of ones in STRING1$ yields the length of STRING4$. This process is continued as set out in FIG. 9 thereby yielding the original seven strings which were concatenated to make up the single string of FIG. 8.

Once strings STRING4$, STRING5$, and STRING6$ are built by nibble encode method 96 they are passed to convert/ encrypt routine 98 for compression.

Convert/Encrypt Routine

Figure 10:
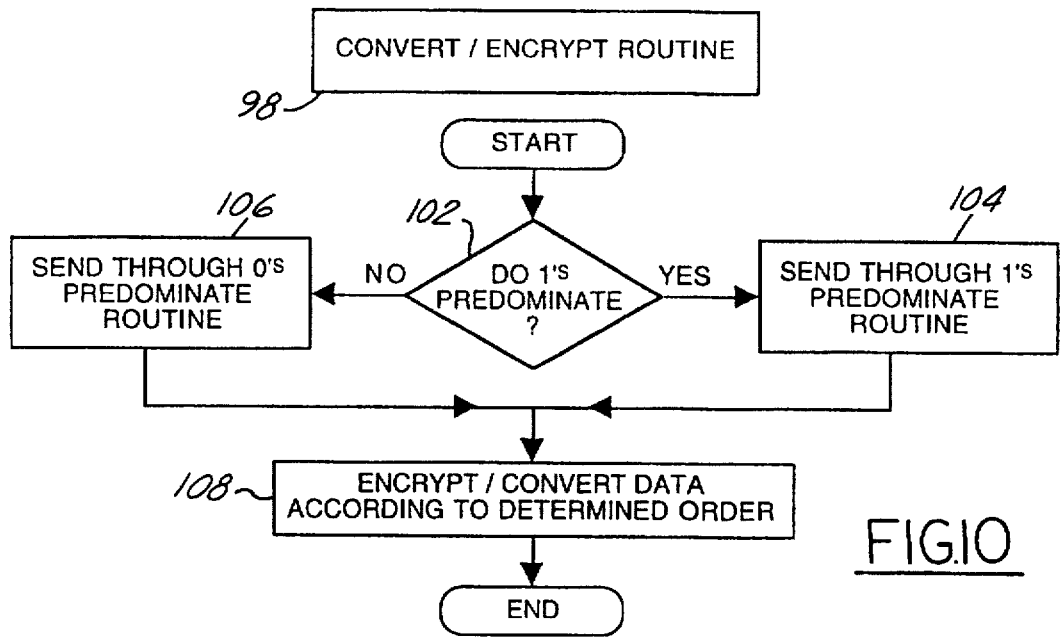
FIG. 10 is a flow diagram of the convert/encrypt routine of the present invention.

Now referring to FIG. 10, convert/encrypt routine 98 is implemented in two stages. Firstly, the string transferred to convert/encrypt 98 routine is examined to determine if the "one" characters comprising the string predominate over the "zero" characters. If the ones do predominate, the string is passed to the ones predominate routine 104 for processing. If the ones do not predominate (i.e. the zeros predominate or there is a tie), the input string is sent through the zeros predominate routine 106. Both the ones predominate routine 104 and the zeros predominate routine 106 operate in a similar way inasmuch as they both produce three output strings. At least one of these strings is operated on by algorithm 108 which compresses the data string. The zeros predominate routine 106 is explained in conjunction with Table 2.

TABLE 2

"0's" PREDOMINATE (OR TIE)

| Input string parsed two bits at a time/ output string | TC1$ | TC2$ | TC3$ |
|---|---|---|---|
| 00 | 0 | 0 | X |
| 01 | X | 1 | 1 |
| 10 | X | 1 | 0 |
| 11 | 1 | 0 | X | x = no change

When processing an input string through zeros predominate routine 106, the input string is parsed two bits at a time. The value of the two parsed bits is examined and a zero character or a one character is added to two of three output strings— TC1$, TC2$, and TC3$—in accordance to the Table 2. Thus zeros predominate routine 106 operates on an input string to generate three output strings.

The ones predominate routine 104 operates in a similar manner to the zeros predominate routine 106 except it assigns values to its three output strings in accordance with the scheme set out below in Table 3.

TABLE 3

"1's" PREDOMINATE

| Input string parsed two bits at a time/ output string | TC1$ | TC2$ | TC3$ |
|---|---|---|---|
| 00 | 1 | 0 | X |
| 01 | X | 1 | 1 |
| 10 | X | 1 | 0 |
| 11 | 0 | 0 | X | x = no change

An important attribute of the zeros predominate and ones predominate methods set out in Tables 2 and 3, is that they permit the input string to be easily reconstructed (or decoded) from the three output strings. A decode tree for decoding information which was encoded using Table 2, is set out in FIG. 11. Thus, in accordance with FIG. 11, the first bit in TC2$ is examined to determine if it is a zero or a one. If it is a zero, the first bit of TC1$ is examined to determine if the original 2 bits in the input string were "00" or "11". If the first bit in TC2$ is a 1, the first bit in TC3$ is examined to determine if the original two bits in the input string were "10" or "01". Thus, knowing the contents of TC1$, TC2$, and TC3$, one can easily reconstruct input data string.

Another feature of the zeros predominate scheme of Table 2 is that a count of the bits in TC2$ indicates one half of the total bits contained in the input string. Thus, by knowing the length of TC2$ we know that the input string was twice as long. Also, a count of the number of zeros in string TC2$ yields the number of bits in TC1$ and a count of the ones in TC2$ brings forth a count of the number of bits in TC3$. This feature will prove invaluable, as we will see later, for packaging the compressed information. A decode tree for Table 2 is set out in FIG. 12 and works identically to the decode tree of FIG. 11. Likewise, all of the advantages discussed in connection with Table 2 are equally applicable for the method of Table 3 and accordingly, a discussion of such will not be duplicated. An example is set out in FIGS. 13A through 13F wherein an input string is converted into three strings—TC1$, TC2$, and TC3$ using the methodology set out in Table 2. FIGS. 13B through 13F show how these three strings are used to reconstruct the original input string using the decode tree of FIG. 11.

Figure 11:
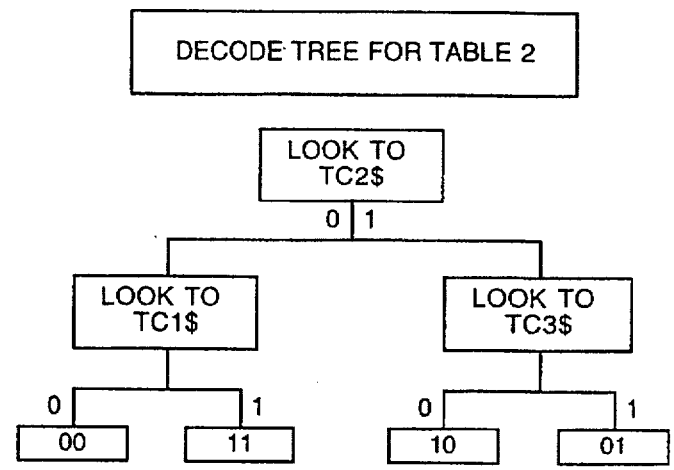
FIG. 11 is a decode tree for decoding data that was encoded using the zero's predominate algorithm of Table 2.
Figure 12:
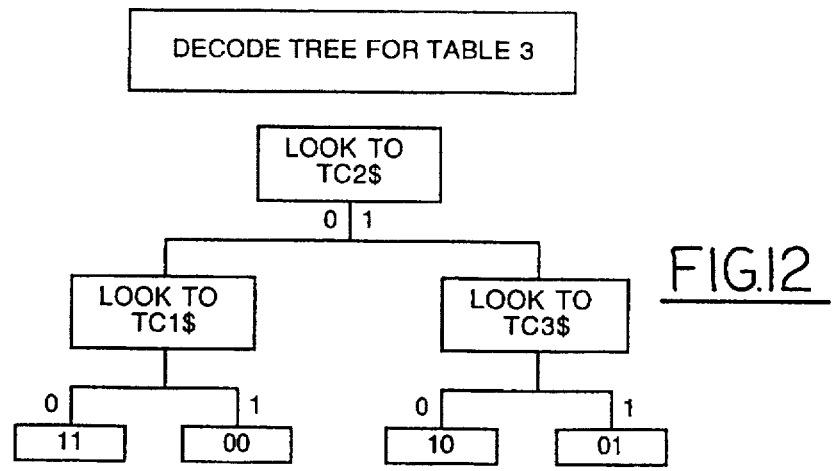
FIG. 12 is a decode tree for decoding data that was encoded using the the one's predominate algorithm of Table 3.

Now referring to FIGS. 13A through 13F, an input string is operated on using the convert methodology of Table 2 to generate three strings, TC1$, TC2$, and TC3$ (see FIG. 13A). The decode tree of FIG. 11 is applied to the first bit in TC2$. Because this first bit is a zero, the decode tree of FIG. 11 dictates that we look to the first bit in TC1$ to determine its value. Thus, a value of "00" for TC1$ and TC2$ respectively generates an input string value of "00" (see FIG. 13B). These two bits of TC1$ and TC2$ are discarded and the remainder of their string values are shifted left by one bit and the process is repeated (see FIG. 13C through 13F) until no bits remain. It is important to note that neither the zeros predominate routine 106 nor the ones predominate routine 104 compress data. The combined length of TC1$, TC2$, and TC3$ is always equal to the original length of the input string. However, both routines 104, and 106 are effective for zero biasing TC1$ and, in some cases depending on the particular bit pattern of the input string, may also be effective for zero biasing TC3$. As a rule, the data within TC2$ tends toward even bias.

Figure 14:
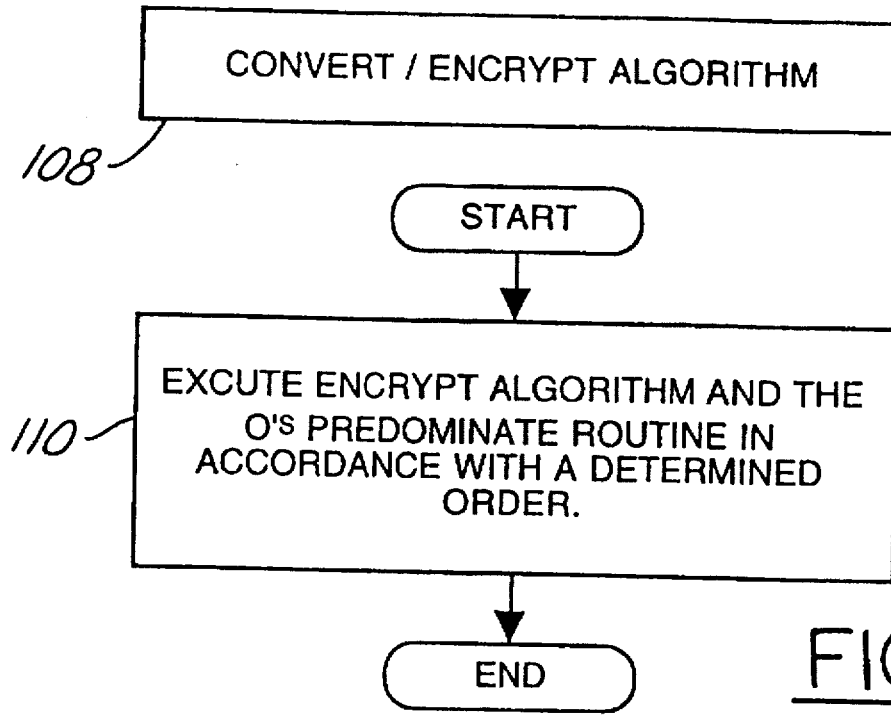
FIG. 14 is a general flow diagram disclosing the convert/encrypt algorithm of the present invention.

Now referring to FIG. 10 and FIG. 14, encrypt/convert algorithm 108 is comprised of executing the zeros predominate routine and the encrypt routine in accordance with a determined order. We have already examined the zeros predominate routine and no further explanation is needed. However, the encrypt routine must be discussed before the convert/encrypt algorithm 108 can be fully understood. What follows is a description of the encrypt algorithm.

Encrypt Algorithm

The operation of encrypt algorithm is best understood in conjunction with Table 4.

TABLE 4

ENCRYPT ALGORITHM

| Input string parsed two bits at a time/ output string | TE1$ | TE2$ | TE3$ |
|---|---|---|---|
| 00 | 0 | X | X |

TABLE 4-continued

ENCRYPT ALGORITHM

| Input string parsed two bits at a time/ output string | TE1$ | TE2$ | TE3$ |
|---|---|---|---|
| 01 | 1 | 0 | 0 |
| 10 | 1 | 1 | X |
| 11 | 1 | 0 | 1 | x = no change

Figure 15:
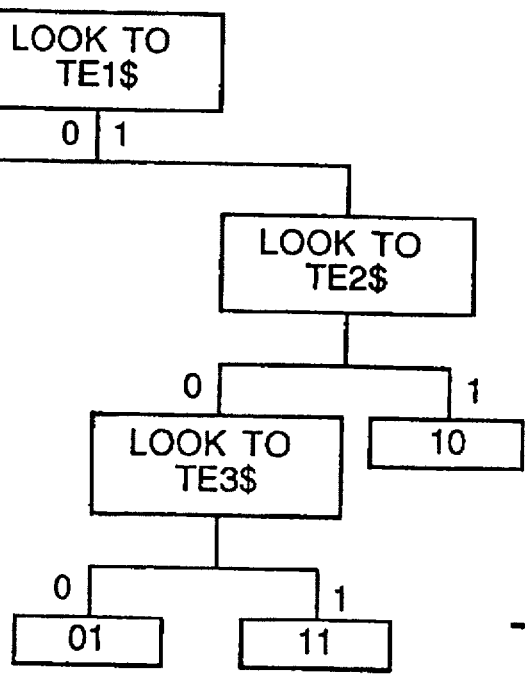
FIG. 15 is a decode tree for decoding information encoded by the encrypt algorithm of Table 4.

The use of Table 4 is closely analogous to the manner in which Tables 2 and 3 were used. The encrypt algorithm operates by parsing an input string two bits at a time. The value of the two parsed bits determines whether or not a bit will be concatenated onto one of three output strings. The value of the two parsed bits also determines what the value of that concatenated bit will be. The result of applying the encrypt algorithm to an input string is the generation of three output strings—TE1$, TE2$, and TE3$. The input string is easily reconstructed if the values of the three output strings are known. This reconstruction simply involves applying the decode tree of FIG. 15. The application of the decode tree of FIG. 15 is identical to the manner in which the previously discussed decode trees of FIGS. 11 and 12 were applied, and accordingly a detailed discussion of the application of the decode tree of FIG. 15 is unnecessary.

An example of applying the encrypt algorithm of Table 4 is set out in FIGS. 16A through 16F. In FIG. 16A a ten bit input string is operated on by the encrypt algorithm of Table 4 generating output strings TE1$, TE2$, TE3$. These three strings are operated on according to the decode tree algorithm of FIG. 15 to faithfully reproduce the ten bit input string (see FIGS. 16B through 16F). An important aspect of the encrypt algorithm of Table 4 is its ability to compress zero biased data. For example, in FIG. 16A the input string is highly zero biased (80 percent zeros). This is an ideal bias arrangement for the encrypt algorithm and, it reduces the ten bit string to seven bits (30 percent reduction). Thus, in view of this example, it is easily understood that if an input string is processed by the encrypt algorithm, the data in the resultant three strings will be compressed if the input string is zero biased. It has also been demonstrated that if the routines which work in conjunction with the encrypt algorithm (such as nibble encode) are successful in supplying it with strings of data which are heavily zero biased, the encrypt algorithm will be effective for greatly compressing the data. It is also apparent, in viewing the encrypt algorithm of Table 4 that if the algorithm is allowed to operate on input strings which are biased with ones, the algorithm will expand the input data causing the total length of data to grow. For example, if the ones complement of the ten bit input string of FIG. 16A is processed by encrypt algorithm, the combined length of strings TE1$, TE2$, and TE3$ is 15 bits long—an expansion of 150 percent. For obvious reasons, expansion of data is an undesirable feature associated with any compression routine and sufficient software traps must be put in place to prevent such an occurrence. Such traps were previously discussed in conjunction with block 80 of the flow chart of FIG. 2.

Having now discussed the encrypt and convert algorithms individually, several methods will now be set forth for combining multiple applications of both the encrypt and convert methodologies to illustrate one aspect of the recursive nature of the present invention. The ability of the encrypt/convert algorithms 108 to be applied to a given set of data time and time again, enables the compression methodology of the present invention to form a powerful, data compression "engine." The interplay between convert/encrypt algorithms to recurse a given set of data is most easily understood by way of the following example.

Recursion Methodology Employed When Using Convert and Encrypt Algorithms

Now referring to FIGS. 3A, 5A, 5B, 10, 17A, and 17B, nibble encode method 96 is applied to a hypothetical input string generating strings STRING1$, STRING2$, . . . STRING7$. In this hypothetical case, let us assume that STRING4$ is highly biased with zeros therefore forming an ideal candidate to be processed by convert/encrypt routine 98. This hypothetical string is selected and passed to convert/encrypt routine 98 where it is sent through zeros predominate routine 106. FIGS. 17A and 17B depict the operation of our conversion algorithm on our hypothetical input string STRING4$ (hereinafter conversion is synonymous with zeros predominate routine of Table 2). As is evident from the right hand columns of FIG. 17, our hypothetical input string contains 64 bits and enjoys a zero bias of slightly greater than 78 percent. The zeros predominate routine operating on the input string produces three output strings—TC1$, TC2$, and TC3$. As discussed earlier, the zeros predominate routine is not a compression algorithm inasmuch as it does not reduce the total number of data bits under consideration; however, it does operate to create at least one zero biased string. In our example, the zero biased string is TC1$ which enjoys a 95 percent zero bias. Now referring to FIG. 18, thus so far we have processed the 64 bits contained in hypothetical input string STRING4$ to create three output strings—TC1$ (20 bits long), TC2$ (32 bits long), and TC3$ (12 bits long).

Figure 19:
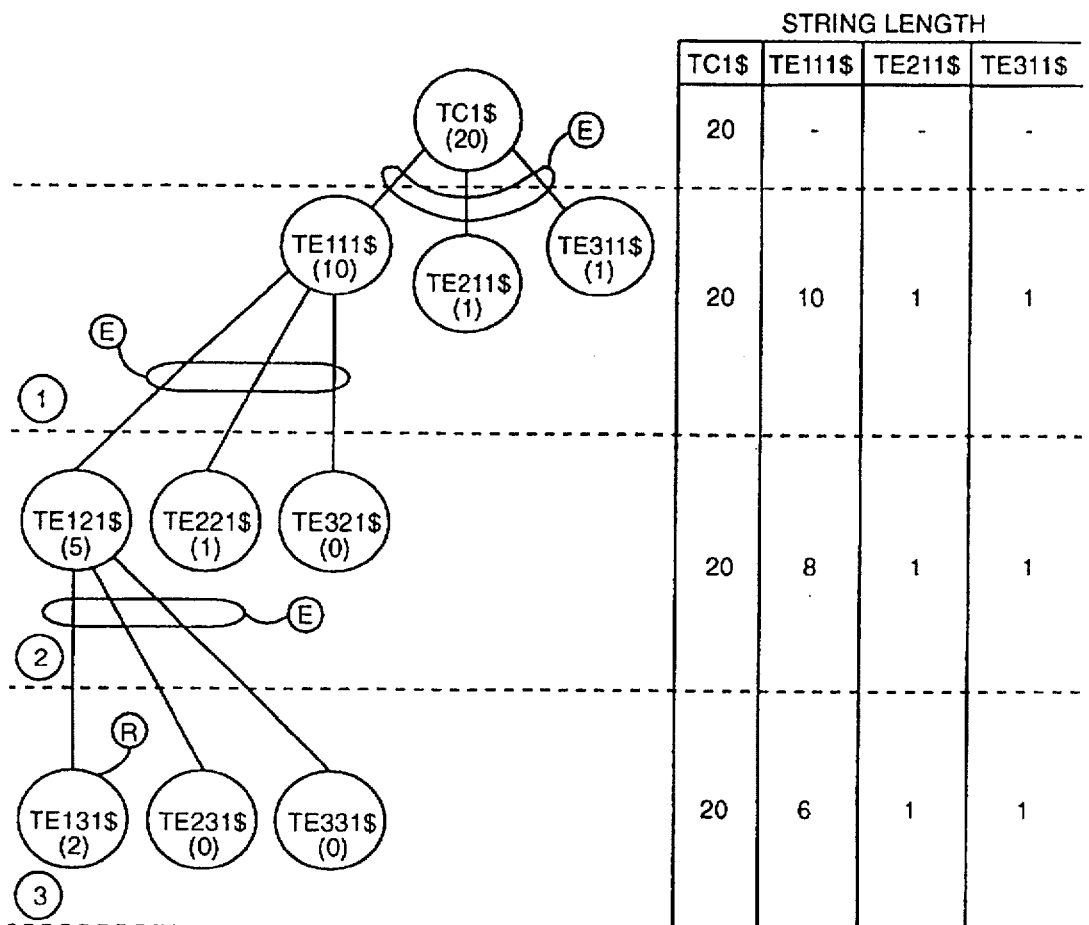
FIG. 19 is a graphical presentation of applying the convert/encrypt algorithm of FIG. 14 to string TC1$.

Now referring to FIGS. 19 and 20, because TC1$ enjoys the highest zero bias of any of our output strings, it is the most likely candidate of the three strings to be processed through convert/encrypt algorithm 108. The processing of TC1$ through algorithm 108 is depicted in FIG. 19 and shown analytically in FIG. 20. One such method which could be used for processing a string through algorithm 108 is to first process the input string through the encrypt algorithm of Table 4 and determine if it results in compressing the data. For example, during the first pass of TC1$ through encrypt algorithm 108, three strings are produced TE111$ (10 bits long), TE211$ (1 bit long), and TE311$ (1 bit long). This results in reducing the overall length of TC1$ by 8 bits. If no reduction would have occurred, or if data expansion would have occurred, we would have known that encrypting data string TC1$ was not beneficial and we would then apply the convert algorithm of Table 2. Thus, one possible convert/encrypt algorithm 108 is to first process an input string using the encrypt algorithm to determine if data compression results. If no compression results, the string is converted (using the zeros predominate methodology). This particular approach is referred to as the "process and see" approach. Continuing to apply the "process and see" approach to the output strings, we now make each output string TE111$, TE211$, TE311$ an input string and process each through our encrypt algorithm. As is disclosed in FIG. 19, encrypting TE111$ results in a 4 bit reduction of data. Applying our encryption scheme to string TE211$ we see that our encryption routine does not operate on single bit strings so we omit any further processing of this "leg.". In some instances, the operation of encrypt algorithm will cause the string to grow. In these cases we do not in fact perform the encrypt operation and omit from any further processing of that leg. Because string TE311$ is 1 bit long, we omit any further processing of it.

Again applying our "process and see" approach to the three strings created by encrypting TE111$, we find that the encryption of TE121$ results in a total reduction of 2 bits. In this particular application of the encryption routine because string TE121$, contains an odd number of bits, there is a remainder bit (or residue) of 1 bit (see FIG. 19). This will always be the case when a string containing an odd number of bits is processed through either the encryption routine or the conversion routine. Each step we have just explained in applying the "process and see" approach to recursing string TC1$ is layed out in FIG. 20. The net result in applying the "process end see" recursion method to string TC1$ is a total reduction in the length of TC1$ of 8 bits or 60 percent.

Figure 18:
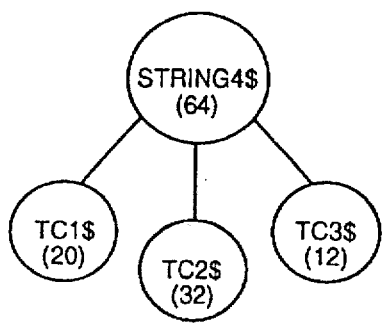
FIG. 18 is a graphical representation of creating three output strings by virtue of applying the zero's predominate routine on a single input string.
Figure 21:
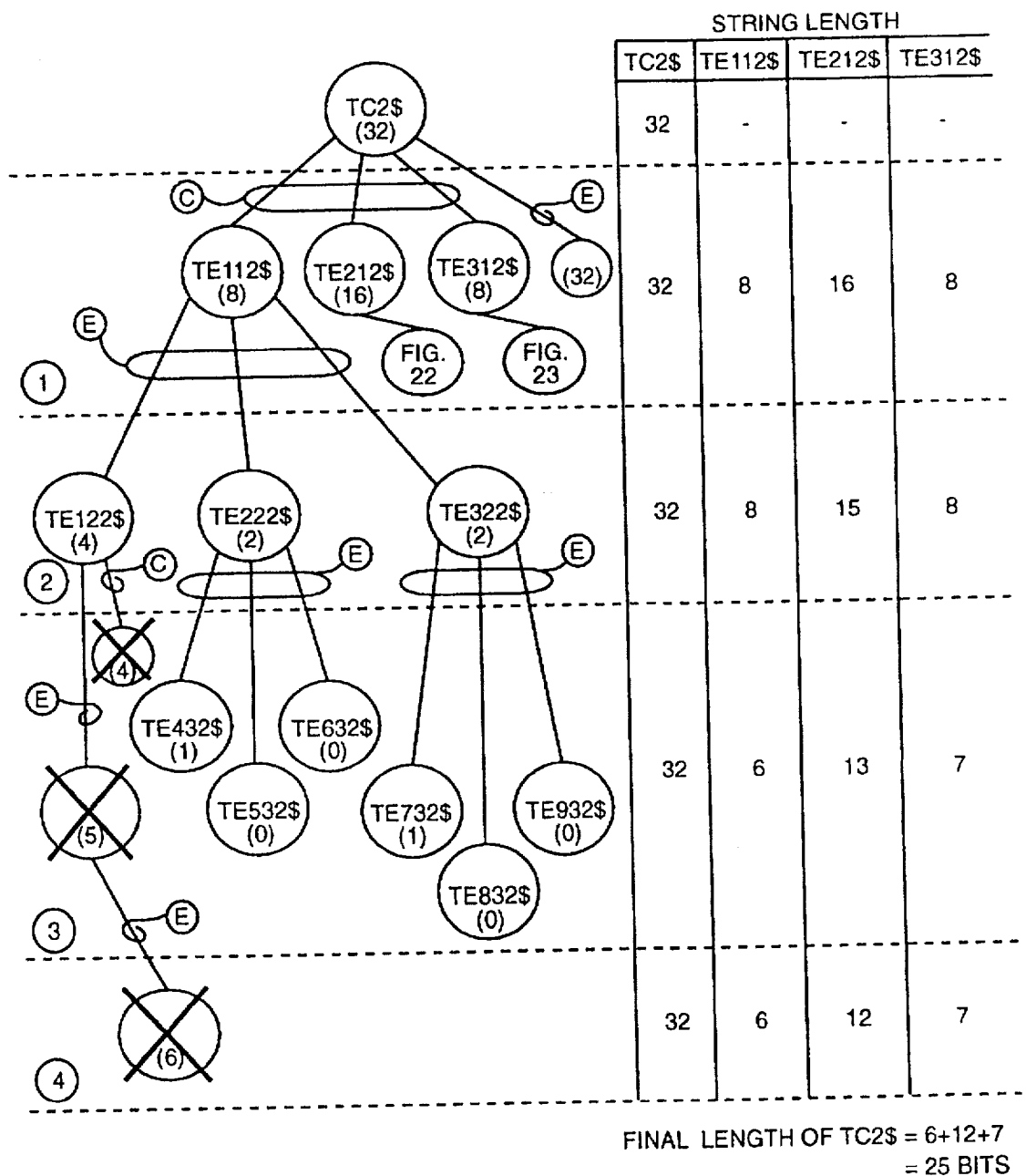
FIG. 21 is a graphical presentation of the application of convert/encrypt algorithm to string TC2$.

Now referring to FIGS. 18 and 21, the same approach that was used in compressing TC1$ is now applied to TC2$. Specifically, first we apply the encryption algorithm to determine if compaction results. In the example of TC2$, applying the encryption routine to the 32 bit string of TC2$ does not result in any compression (the total length of the three strings created by the encryption routine are equal in length to the input string). Consequently, we do not encrypt TC2$ but, instead, apply the conversion algorithm. As we have already seen, the conversion algorithm is not a compression algorithm but serves as a tool to force at least one of its output strings to assume a zero bias. Converting string TC2$ results in three output strings—TE112$, TE212$, and TE312$. In turn, each of these three strings are examined, using the "process and see" approach to determine if data compression is possible. Firstly, string TE112$ is encrypted resulting, once again, in three strings with a combined length equal to that of TE112$. At this point, we have exercised two "converts" in a row (the original conversion of string STRING4$ and the conversion of string TC2$). We now encrypt the three resultant strings to determine if any data compression results. Following the course of our "process and see" method, we first attempt to encrypt string TE122$ but find that this results in a growth of 1 bit. We assume that any pursuit of this string will be fruitless and, we apply the convert algorithm to string TE122$ finding that it results in a string of 4 bits which themselves cannot be further compacted. Thus, string TE122$ cannot be further compressed.

Figure 22:
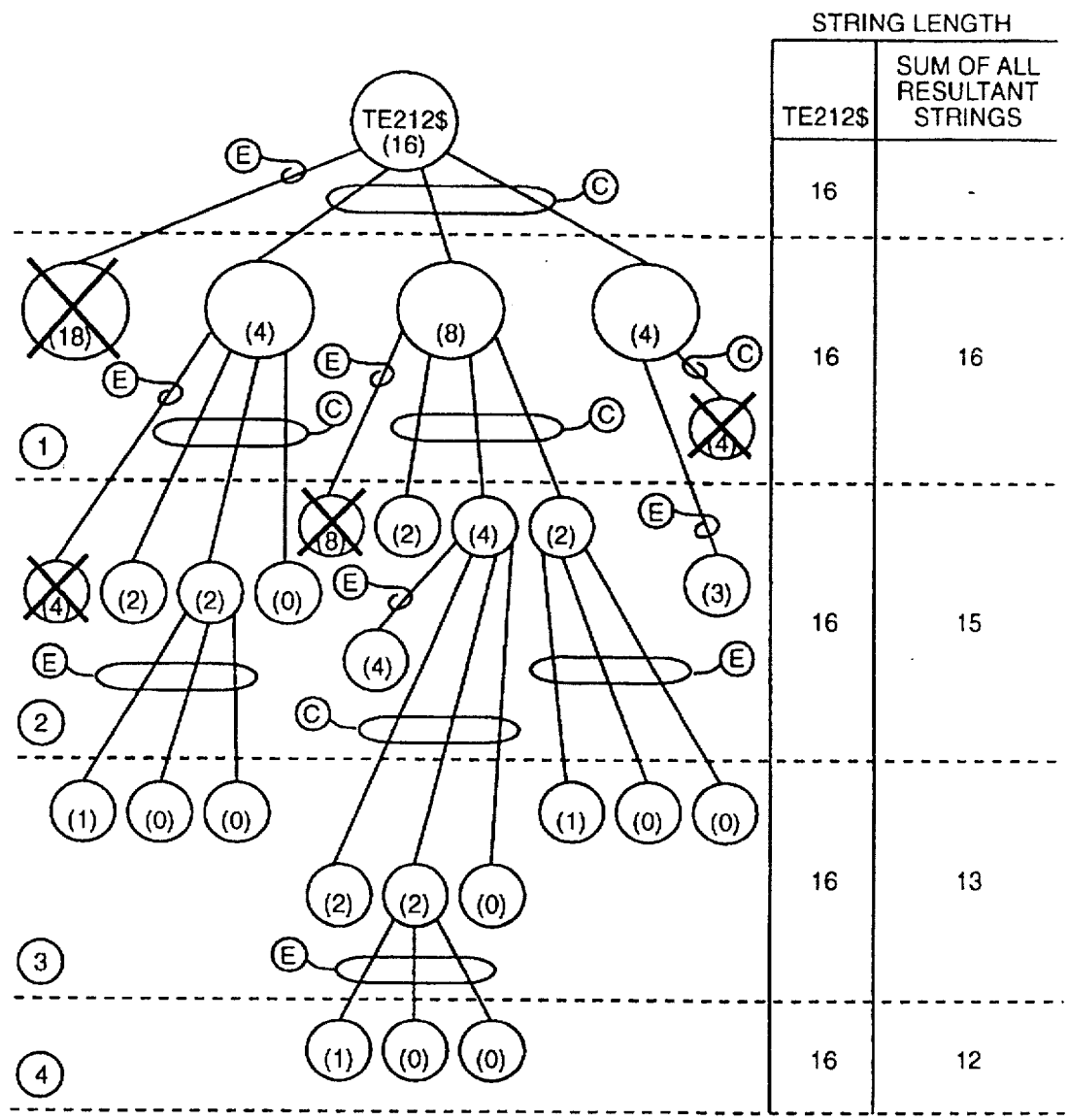
FIG. 22 is a graphical presentation of the application of convert/encrypt algorithm to string TE212$.
Figure 23:
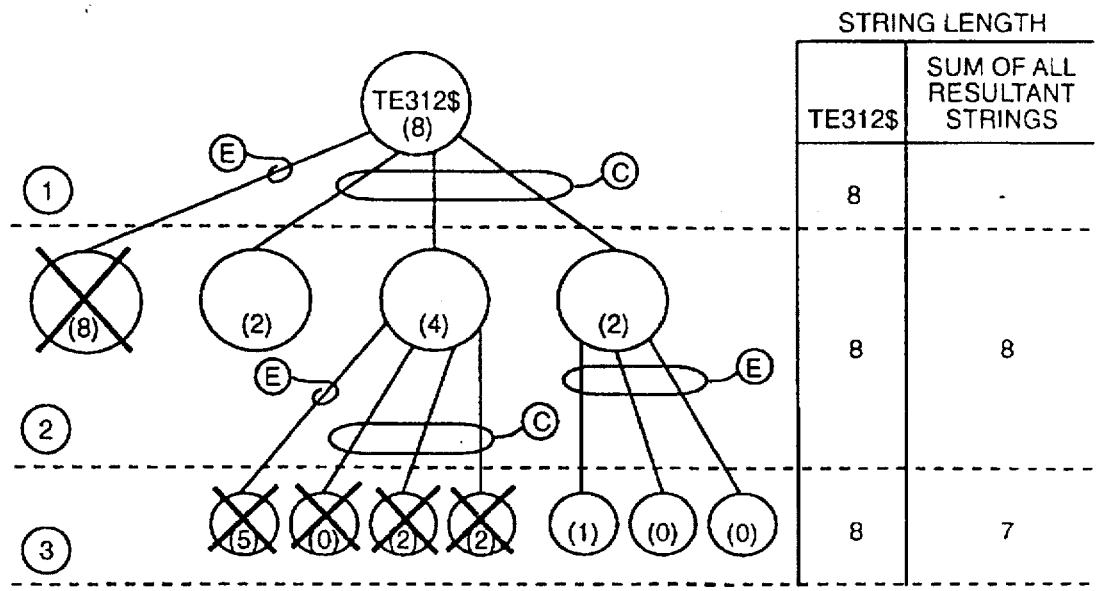
FIG. 23 is a graphical presentation of the application of convert/encrypt algorithm to string TE312$.
Figure 24:
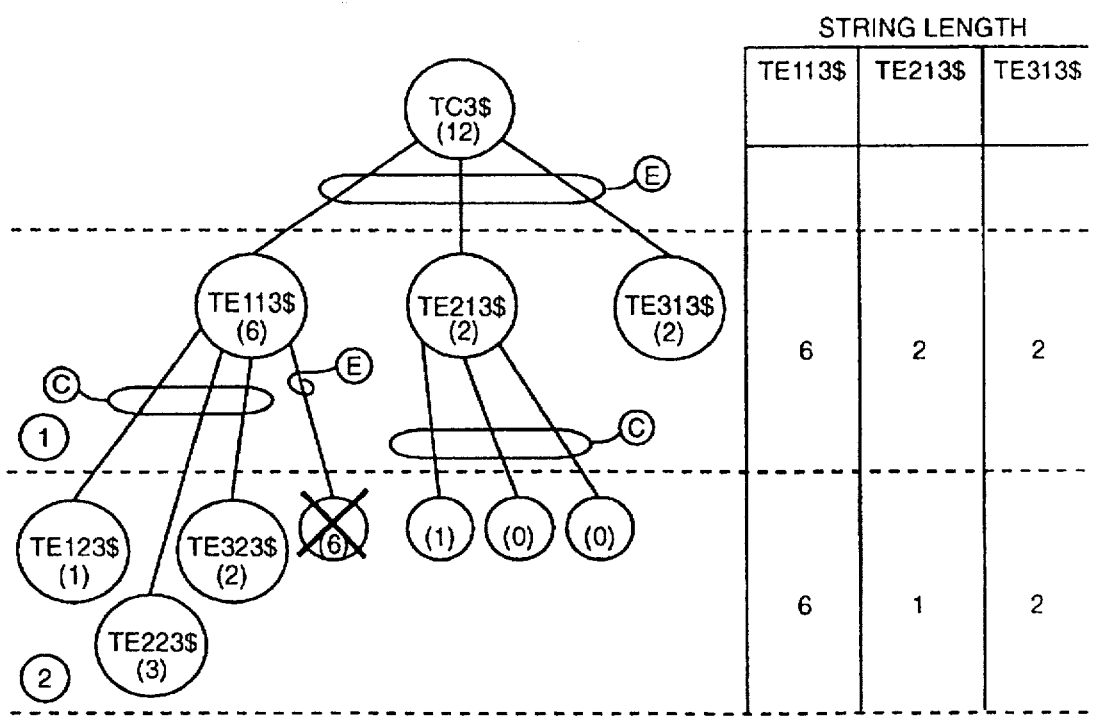
FIG. 24 is a graphical presentation of the application of convert/encrypt algorithm to string TC3$.
Figures 27A, 27B:
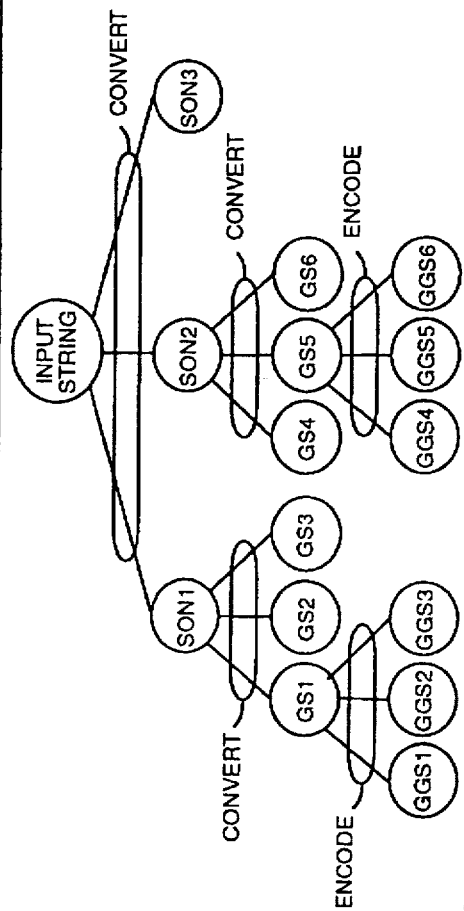
FIG. 27A is a graphical presentation of the convert/ encode algorithm as applied to a given input string.
FIGS. 27B and 27C set forth a table illustrating the convert/encrypt algorithm applied to the input string of FIG. 27A.
Figure 27C:
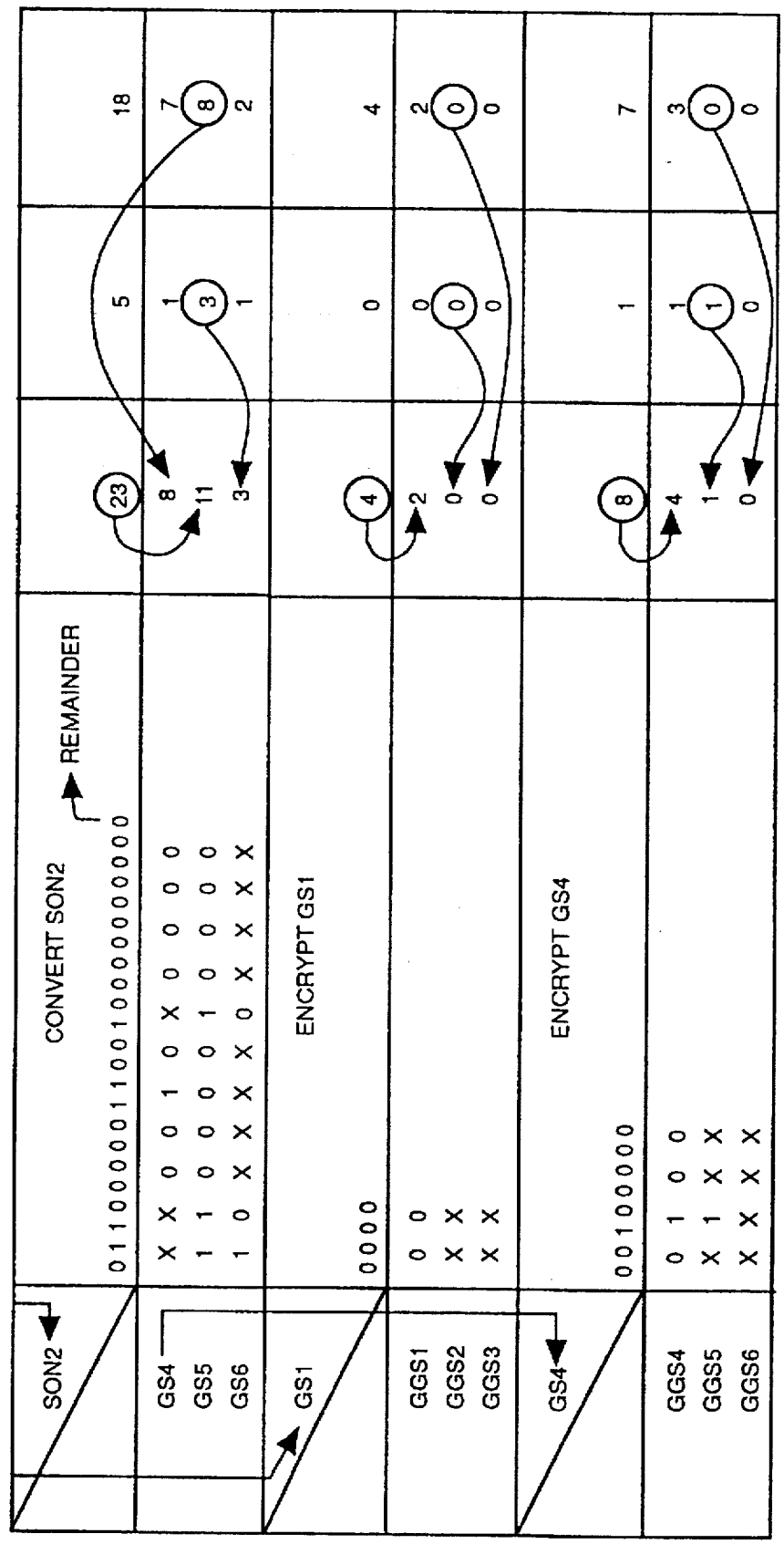
Figure 28:
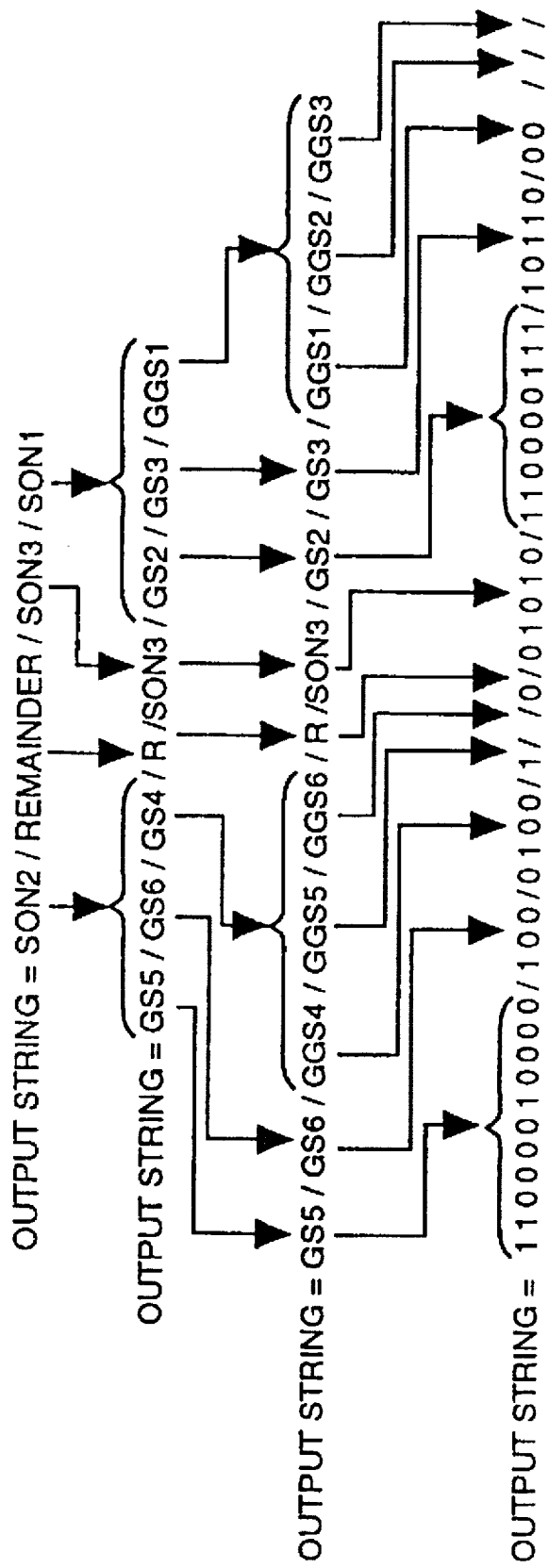
FIG. 28 is the string package sequence used for packing the string created by the convert/encode methodology set out in FIG. 27A.

It is important to note that if the results of encrypted string TE122$ are themselves encrypted (see FIG. 21) it results, once again, in a gain of 1 bit. Thus, we see that blindly applying the encrypt algorithm can actually cause the data to expand. The analysis of strings TE212$ and the analysis of strings TE312$ are set out in FIGS. 22 and 23, respectively. When all of the reductions are totaled, the "process and see" approach results in a reduction in the length of string TC2$ of 7 bits or slightly less than 21 percent. When the "process and see" analysis is applied to string TC3$, as set forth in FIG. 24, a 3 bit reduction (or 25 percent) is gained in the length of string TC3$. Thus, in view of the above, we see that when the convert/encrypt algorithm 108 takes the form of a "process and see" approach we are able to obtain a substantial overall compression of our initial string STRING4$. In our example, we were able to reduce STRING4$ by 22 bits or approximately 34 percent.

Although using the "process and see" approach when implementing the conversion/encryption algorithm 108 produces substantial data compression, implementing such an approach does not lend itself to simple elegant programming techniques. This is so primarily because the "process and see" approach is designed to optimize the compression result at each mode of our process. Although such an approach compresses the data very quickly, when it comes time to decode the encrypted or converted data, the decision made (i.e., to convert or encode) at every branch must be recalled. Although a scheme for logging such information is fairly straight forward, it adds undesirable complexity to the software. Additionally, it is believed that such optimization at each node is not necessary because if some compressible data is not compressed by the first execution of convert/ encrypt routine 98 it will be picked up during one of the subsequent passes of the data as the data is recursed by compression routines 70 (see FIG. 2) at a subsequent pass. Thus, we see that recursion takes place at two levels in the disclosed compression methodologies of the present invention. At the first level, recursion takes place during the multiple applications of the convert and encrypt routines as implemented by the convert/encrypt algorithm. Recursion, on a second level, takes place by the multiple application of compression routines 70 as they are applied to reduce data at or below a required size 78. In view of this, it is not believed that the "process and see" approach to using the convert/encrypt algorithm 108 achieves superior compression results over non-optimized strategies (although it probably produces faster results). Accordingly, at the cost of expending more time, simplified recursion/encryption algorithms can be employed. A few simple recursion/encryption algorithms will now be discussed.

In formulating a more simplified scheme, it is beneficial to review the graphical representation set forth in FIGS. 19 through 24. From these graphs it is generally observed that the greatest compression "fruit" is collected from the left most branches. This trend is observed at virtually every level. For example, our greatest overall compression when viewed amongst strings TC1$, TC2$, and TC3$ was the 60 percent reduction realized from string TC1$. TC1$ is the left most string as derived from string STRING4$. Secondly, it is observed that the right most string is generally more fruitful than the middle string when "squeezed" by our compression/encryption algorithm. These trends should not surprise us because, as discussed earlier, the convert routine is designed to "load" TC1$ (the left most branches) with as many zeros as possible. Additionally, TC2$ tends to approach a 50 percent bias condition. Because the left most branches tend to contain the greater amount of zeros, the encryption algorithm is most effective on these strings.

With this in mind, one more simple convert/encrypt algorithm would be to look at the left most branches when doing our analysis. For example, we could decide to always do a convert and then an encode, but only encoding the left most branch of the convert. Additionally, we could do a first convert, a second convert on the left most branch of the first convert, and then an encrypt but only encrypting the left most branch of the second convert. A slightly more sophisticated scheme includes analyzing the data on a block by block basis and empirically determining optimized convert/ encode algorithms for select data distribution patterns. Each optimized algorithm would be assigned a certain word value which would be stored as the first word in the incoming stream of data. By creating a 2 bit word for this purpose, four optimized algorithms could be utilized. By using 3 bits, eight optimization algorithms could be encoded, etc.

It is obvious that strings STRING5$ and STRING6$ can be passed through the encode/convert algorithm in the same way that we have just demonstrated for STRING4$. Because strings STRING5$ and STRING6$ contain more zeros than ones, we would also expect that the compression/ encryption algorithm 108 would be fruitful in compressing the length of these strings. Upon completion, of a single pass of the nibble compression routine 90, we have created four uncompressed strings (STRING1$, STRING2$, STRING3$, and STRING7$) and three compressed strings (STRING4$, STRING5$, and STRING6$). The compressed strings are represented by any number of a series of variable length bit strings, each of which were generated by one or more applications of the encrypt algorithm and the convert algorithm. An example follows which demonstrates how each of the various strings and string portions which were created during a single pass of nibble compression routine 90 are packaged in a way which allows them to later be used to reconstruct the original input string.

Now referring to FIGS. 3A, 8, 9, and 25, assume for the sake of this example that nibble encode method 96 passed its STRING4$ (and only this string) to convert/encrypt routine 98 for compressing. Also assume that we are using a very simple encrypt/convert algorithm of simply performing a single encrypt of the data passed to the convert/encrypt routine. In FIG. 25 we see that the encrypt algorithm processes the 32 bit input string passed to it to generate a 33 bit output string comprised of TE1$, TE2$, TE3$. As a side note, we observe that the lack of sufficiently high zero bias in our input string causes our encrypt routine to actually expand the data by 1 bit. Although this negative result is observed, it does not alter or obscure this example of packing the output string.

In FIG. 25, we observe that the total number of bits contained in output string TE1$ (16 bits) is exactly one half of the total number of bits contained in input string. This will always be the case as long as the input string contains an even number of bits. In the event that the input string contains an odd number of bits, there will be a remainder and this case will be addressed in the example of FIG. 26.

Also observe that a count of the number of ones in TE1$ yields the total number of bits in string TE2$. Further, a count of the total number of zeros in TE2$ yields a count of the total number of bits in TE3$. If the three strings are concatenated in the order of TE1$/TE2$/TE3$, they can be readily separated from one another by simply knowing the length of the original input string. For example, in this case knowing that the original input string was 32 bits long, we first remove the first 32 bits from the concatenated string giving us our TE1$ string. We then count the number of ones in our TE1$ string giving us a count of the number of bits which must be next removed from our concatenated string to form the TE2$ variable. Next, the number of zeros are tallied in the TE2$ string yielding the number of bits to be assigned to TE3$. Thus, in this example we see that the three output strings created by the encrypt routine are uniquely defined in relation to one another such that they can be concatenated in a predetermined order and thereafter independently identified and separated from the concatenation by merely knowing length of the original input string. Accordingly, not only is the encrypt routine of the present invention a powerful tool for compressing zero bias data, but it also operates to create output strings which when concatenated are easily decodable.

Once the encrypt routine creates the concatenated output string of FIG. 25, this string takes the place of STRING4$ as represented in the string package sequence set out in FIG. 8. Consequently, when executing the decode tree of FIG. 9, at the appropriate time when a count of the number of zeros or ones in STRING4$ is needed, the encoded string STRING4$ is separated into its component strings (TE1$, TE2$, TE3$) and decoded in accordance with the decode tree of FIG. 15. This reconstructs the original input string and then the decode tree of FIG. 9 is able to proceed in decoding the string chain sequence used for nibble encode methodology.

Now referring to FIG. 26, in a second example, a more complex encode/convert algorithm is employed than that employed in the first example. In the second example, we employ a convert step and then an encrypt step. This second example will now be explained in conjunction with FIG. 26.

Firstly, we use our convert routine to act upon a 32 bit input string thereby generating TC1$, TC2$, TC3$. We note that the total number of bits in TC2$ is exactly one half of the total number of bits found in our input string. This is always the case unless input string contains an odd number of bits, in which case a remainder bit is generated. We observe that by counting the number of ones in our TC2$ string we obtain the number of total bits in TC3$. Additionally, a count of the number of zero bits in TC2$ is a direct measure of the total bits in TC1$. In keeping with this example, we take TC1$ and use that as our input string for encrypting. Because TC1$ contains an odd number of bits, we are left with a remainder bit equal to zero. This remainder bit is logged and the encrypt algorithm is executed as it normally would encrypting TC1$ and treating the remainder bit as non-existent. If we build our final output string in the order indicated in FIG. 26, we see that our original 32 bit input string can be easily reconstructed using similar techniques to those set out in conjunction with FIG. 25.

Specifically, by definition we know the length of our original input string (32 bits) and we simply remove half of that number of bits from our output string giving us TC2$. Counting the number of ones in TC2$ yields the length of TC3$ which is then removed from the output string. Counting the number of zeros in TC2$ and dividing that count in half (and discarding any fractional portion) yields the total number of bits in TE1$. Because TC1$ contained an odd number of bits we know that there must be a remainder bit following the 4 bits assigned to TE1$ and we accordingly strip off the remainder bit and concatenate it onto the end of the TE1$ string. Counting the total number of ones in TE1$ yields the total number of bits contained in TE2$ and counting the total number of zero bit values in TE2$ yields the total number of bits in TE3$. TE1$, TE2$, and TE3$ can now be combined by using the decode tree of FIG. 15 to reconstruct TC1$ and, thereafter, TC2$, TC3$, and TC1$ can be combined in accordance with the decode tree of FIG. 7 to reconstruct the original input string.

Now referring to FIGS. 27A, 27B, 27C and 28, a third example of a convert/encrypt algorithm is set forth wherein a convert/convert/encode/encode scheme is used. The various convert/encode steps are applied to the original input string in accordance with the "tree" diagram set out in FIG. 27A. The analysis described in conjunction with the first and second examples above is identical to the analysis applied in conjunction with this third example. All of the strings and string components created during the application of the convert/convert/encode/encode algorithm are concatenated in the manner set out in FIG. 28 to form a single output string. When it is time to reconstruct the original 46 bit input string, the output string is broken into its component strings using the following approach. Firstly, by definition we know the length of our input string, therefore we know that the length of string GS5 must be equal to one half times one half (i.e. one quarter) of the length of the input string. Because our input string was 46 bits in length, string GS5 is equal to 11.5 bits. Discarding any fractional portions yields a length of 11 bits for GS5. We then remove the first 11 bits from output string and counting the zeros therein yields the length of string GGS4. The process proceeds as follows:

Counting the ones in string GGS4 yields the length of string GGS5.

Counting the zeros in string GGS5 yields the length of string GGS6.

Using strings GGS4, GGS5, GGS6 in conjunction with the decode tree of FIG. 15 we can reconstruct string GGS4.

Using strings GGS5, GGS6, GGS4 in conjunction with the decode tree of FIG. 11 yields string SON2.

Observing that string SON2 has an odd number of bits we pick up the trailing remainder bit.

Counting the number of zeros in SON2 yields the length of SON1.

Dividing the length of SON1 by one half yields the length of GS2.

Counting the number of ones in GS2 yields the length of GS3.

Counting the number of zeros in GS2 and dividing that number by one half yields the length of GGS1.

Combining GGS1, GGS2, and GGS3 in conjunction with the decode tree of FIG. 15 yields GS1.

Combining GS1, GS2, and GS3 in conjunction with the decode tree of FIG. 11 yields SON1.

Combining SON1, SON2, and SON3 in conjunction with the decode tree of FIG. 11 yields the original input string.

Now referring to FIG. 3A, to summarize the nibble compression methodology 90 of the present invention, it has been demonstrated that the nibble compression methodology 90 is comprised of a nibble encode method 96 and a convert/encrypt routine 98. Nibble encode method 96 is effective for creating seven strings of data. Some of the strings enjoy a zero bias. The convert/encrypt routine 98 is effective for compressing the strings generated by nibble encode method 96 that contain a zero bias. It has also been demonstrated that various encoding techniques are employed by both nibble encode method 96 and convert/ encrypt routine 98 which enable the data strings generated thereby to contain information regarding the length of certain neighboring strings. This encoding technique allows for easy storage/retrieval/reconstruction of original input data.

Now referring to FIGS. 2 and 3A, after all of the data in the source file has been acted upon by nibble compression 90, a check is made 78 to determine if the output file is at or below the required size. Of course, if sufficient compression has been achieved in a single pass through the source file, the program simple ends 88. However, it is the case in many applications that sufficient compression is reached only after multiple recursions 80, 82 through the data. Even in the case where multiple recursions are applied to the data to be compressed, a point may be reached where one of the three compression routines 70 is no longer effective for further reducing the size of the data. At this point, any further recursions are fruitless and, in some instances, may actually cause the data to grow (such as was illustrated earlier in cases where the encryption algorithm is applied to data which is not sufficiently weighted with zeros). In the case where further recursions of compression routine 70 are fruitless 80, we apply routine 84 which is highly effective for compressing randomized data. This randomized data compression routine 84 will now be discussed.

Now referring to FIGS. 2, 3A, 3B, 3C, and 29, after multiple recursions are made using any one of the three compression routines 70, the distribution of ones and zeros in the output file begins to become highly randomized (i.e., the distribution of ones and zeros approaches 50 percent for any size sample taken from the output file). At this point, compression routines 70, although still capable of compressing data, suffer in efficiency.

Figure 29:
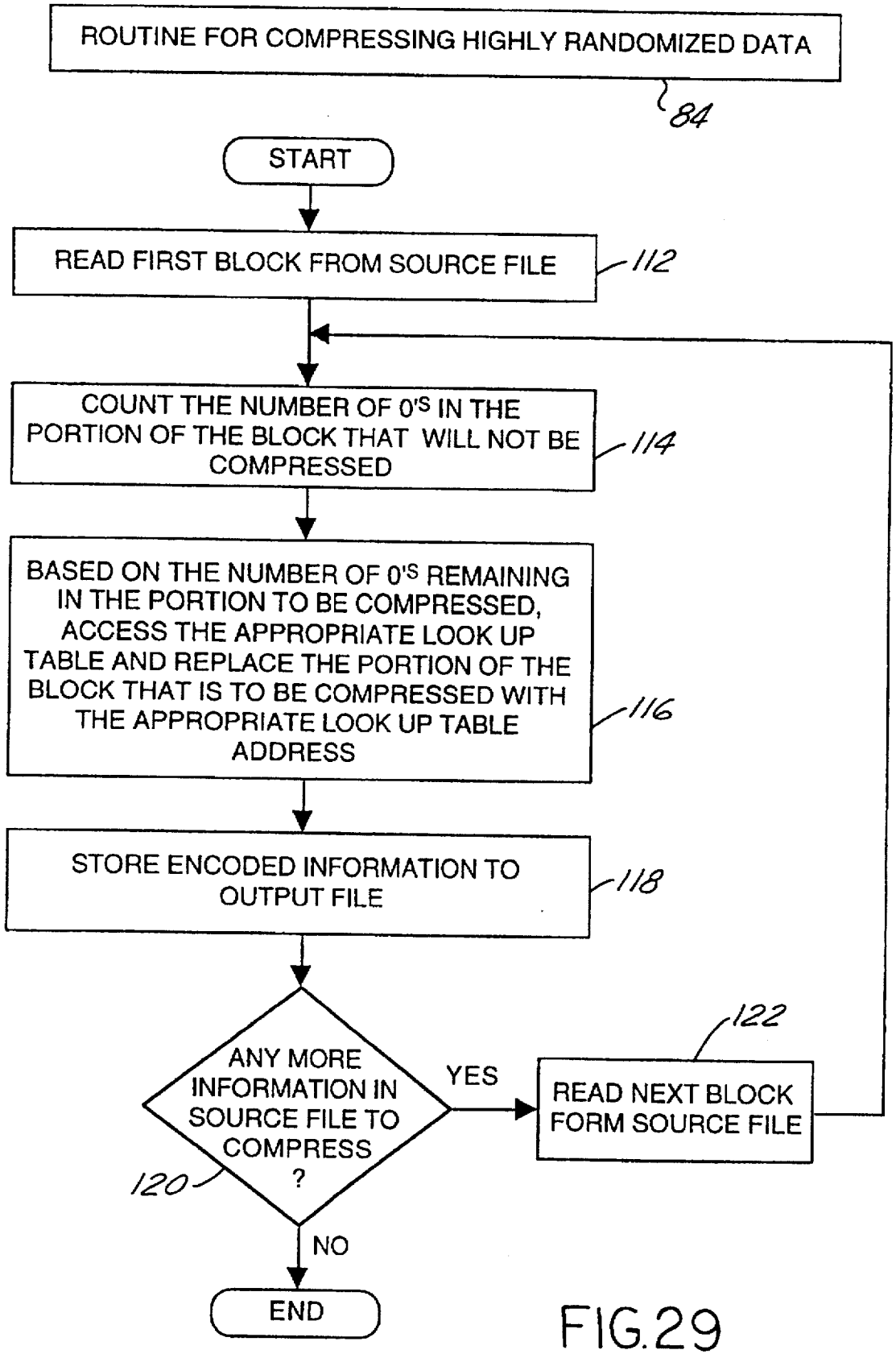
FIG. 29 is a flow diagram showing the method for compressing highly randomized data.

The compression routine of FIG. 29 is adapted to address the particular problems associated with compressing highly randomized data. Now referring to FIG. 29, the methodology of this specific compression routine involves reading a first block of data from a source file containing highly randomized data 112. For the sake of this example, let us assume that 100 bits of data define our block size. Next, a count is taken of the number of zeros in a predetermined portion of that block 114. For example, we would count the number of zeros occurring in the first 80 bits of our 100 bit block. Based on the number of zeros counted, and assuming perfect randomness (i.e. 50 percent zeros and 50 percent ones) we know how many zeros remain in the remaining portion of the block. Knowing this, look up tables can be encoded wherein all of the possible existing bit patterns are linked to a respective address. The remaining portion of the block is discarded and the look up table address is placed in its stead 116. The first portion and the encoded portion of the data are stored 118 and the next block is read from the source file 122 and processed 114 through 118.

It is commonly stated that perfectly entropic data streams cannot be compressed. This misbelief is in part based on the sobering fact that for a large set of entropic data, calculating the number of possible bit pattern combinations is unfathomable. For example, if 100 ones and 100 zeros are randomly distributed in a block 200 bits long, there are $$200C100 = 9.055 \times 10^{58}$$

combinations possible. The numbers are clearly unmanageable and hence the inception that perfectly entropic data streams cannot be compressed. The key to the present compression method under discussion is that it makes no attempt to deal with such large amounts of data and simply operates on smaller portions. An example of randomized data compression routine 84 will now be explained in conjunction with FIGS. 30A and 30B.

In this example, our block size is 200 bits long and we are only compressing the last 5 percent (10 bits) of data of every block. The first step is to count the number of zeros occurring in the first 190 bits. Knowing this we know how many zeros must occur in the last 10 bits assuming perfectly even distribution of ones and zeros. If there are 9 zeros in the last 10 bits, we reference look-up Table 1 (see FIG. 30A) which relates a unique look-up table address to each possible bit pattern. The appropriate look-up table address is selected and concatenated onto the first 190 bits. The entire string is then stored and the next string of 200 bits is read and similarly processed. If after stripping off the first 190 bits, our remaining 10 bits have an 8 zeros bit pattern, look-up Table 2 (see FIG. 30B) would be used to determine the address to concatenate onto the proceeding 190 bits.

By using this look-up table scheme to encode the addresses of various bit patterns, a bit savings ranging anywhere from 10.0 bits to 2.0 bits is possible (see Table 5 below).

TABLE 5

| Zero's Remaining in last 10 bits | nCr | Bits Necessary to Encode Address | Bit Savings |
|---|---|---|---|
| 0 | 0 | 0 | 10–0 = 10 |
| 1 | 10 | 3.34 | 10–3.34 = 6.66 |
| 2 | 45 | 5.5 | 10–5.5 = 4.5 |
| 3 | 120 | 7.0 | 10–7.0 = 3.0 |
| 4 | 210 | 7.8 | 10–7.8 = 2.2 |
| 5 | 252 | 8.0 | 10–8.0 = 2.0 |
| 6 | 210 | 7.8 | 10–7.8 = 2.2 |
| 7 | 120 | 7.0 | 10–7.0 = 3.0 |
| 8 | 45 | 5.5 | 10–5.5 = 4.5 |
| 9 | 10 | 3.34 | 10–3.34 = 6.66 |
| 10 | 0 | 0 | 10–0 = 10 |

To increase the savings, the portion of the block not compacted 114 is reduced leaving a larger remaining portion to be processed 116. For example, if the last 20 bits of a 200 bit block are used (instead of the last 10 bits), then the maximum number of bits needed in the worst case condition are:

$$20C10 = 184,755 \rightarrow 17.6 \text{ bits to encode}$$

And the worst case savings is:

$$20 - 17.6 = 2.5 \text{ bits}$$

Now referring to FIG. 2, after randomized data compression routine 84 has made one pass through the entire source file, a check is once again made to determine if the compacted data is at or below the required size 86. If it is, the program ends 88. If not, the data can either be sent back through one of the three compression routines 70 or, it may be sent back through compression routine 84. One method which could be used to decide whether data should be sent back to routines 70 or routine 84 is to simply monitor the bias of the file. If the file contains a bias below a predetermined level, compression efficiency would most likely be greater with routine 84 if the bias ratio is above a predetermined level, compression routine 70 would most likely offer superior results over routine 84.

It is important to note that although randomized data compression routine 84 has been discussed only in conjunction with perfectly entropic files, it can be applied to files which are not perfectly entropic by simply adding a bit to each sampled block. For example, if this bit is set to 1, this means that this block does not contain entropic data and therefore cannot be operated on by routine 84. If this bit is set to zero, this indicates that the data contained therein can be operated on by compression routine 84.

Now referring to FIG. 31, in decompressing the data compressed by randomized data compression routine 84, a first segment of data is read. And the number of zeros in the non-compacted portion are counted 124, 126. By knowing this count, we can calculate how many zeros must be represented once the compressed portion is decompressed. By knowing how many zeros will be present in the decompressed portion we know, by virtue of our look-up table scheme, how long the address is, and consequently, how long the compacted portion is 128. Next we refer to the appropriate look-up table 130 and replace the encoded data portion with the proper bit pattern 132. This sequence is repeated 138 until the entire contents of the source file are processed 134.

Now referring to FIG. 2, we have now seen how randomized data compression routine 84 operates to compress highly or purely randomized data. We have also seen how routine 84 can be used recursively to make multiple passes through a file and upon each pass causing data compression to occur. Additionally, the interaction between randomized data compression routine 84 and compression routines 70 has been explained and is effective for compressing data regardless of the degree of zero bias which characterizes the data.

Now referring to FIGS. 2, 3A, and 3B, as we have already discussed, nibble compression 90 is one of the three compression routines which could be used in block 70. We will now set forth a second compression routine which could be used in block 70 to affect data compression. This second routine is the distribution compression routine 92 and is generally set out in FIG. 3B.

2. Distribution Compression

Now referring to FIG. 3B, distribution compression 92 takes the same general form as that which we have seen in conjunction with nibble encryption 90 (see FIG. 3A). More specifically, like nibble compression 90, distribution compression uses a two step approach. Namely, first raw data is acted upon by distribution encode method to create strings of data. Some of these strings are then processed by convert/encrypt routine 98 to produce compressed data. Because convert/encrypt routine 98 is identical to the convert/encrypt routine 98 already discussed in conjunction with FIG. 3A, any further explanation will merely be duplicative of that which is earlier set out. Accordingly, what follows is a detailed description of distribution encode method 100 without reference to routine 98.

Figure 32:
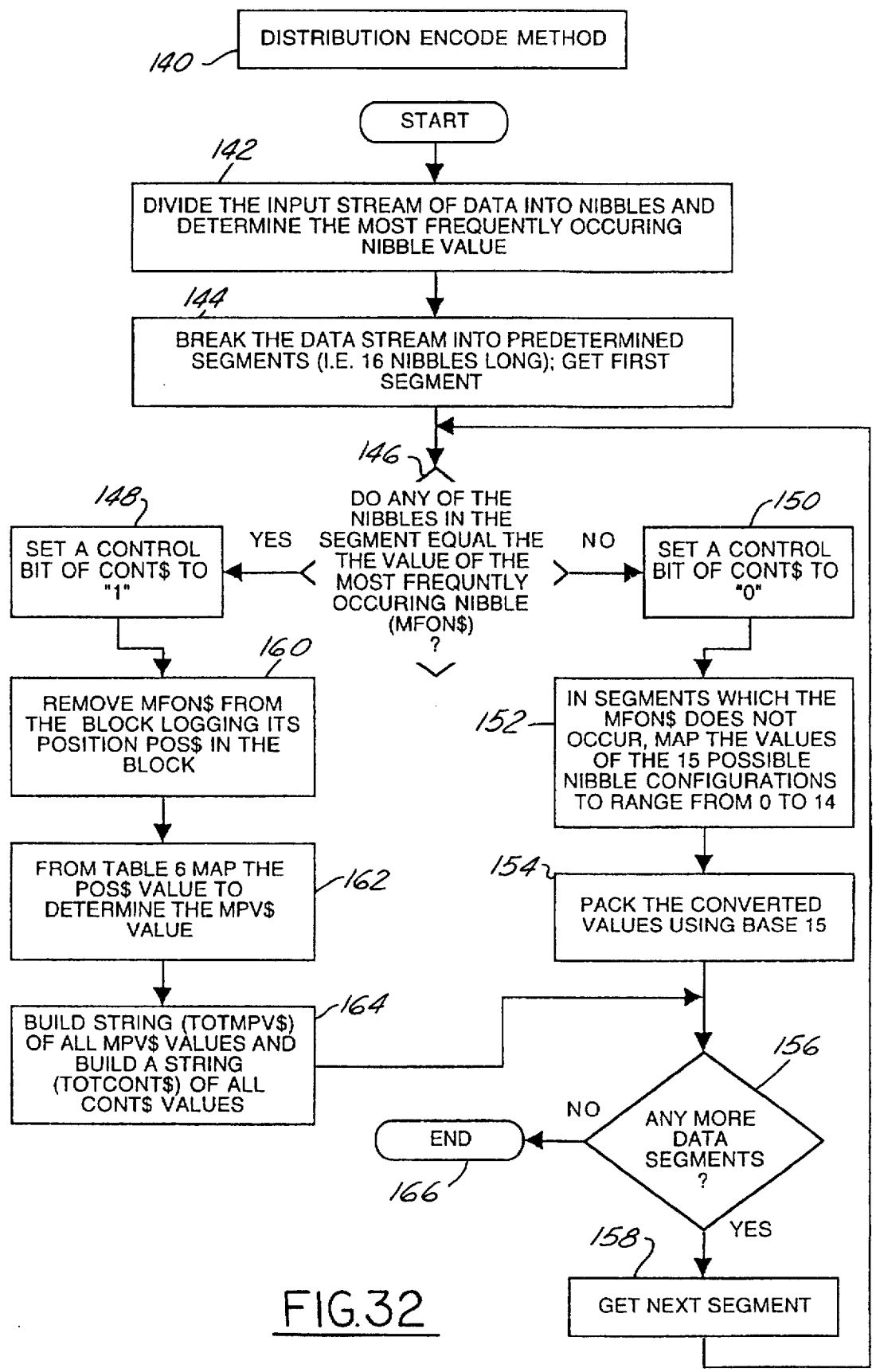
FIG. 32 is a flow diagram for the distribution encode method of the present invention.

Now referring to FIG. 32, distribution encode method 140 operates by first examining the input data, on a nibble by nibble basis, to determine the most frequently occurring nibble value 142. Then, the data stream is broke into predetermined nibble segments 144. Segment length is somewhat arbitrary but segments ranging in length from 10 nibbles to several hundred nibbles tend to be most workable. The first segment is retrieved and its contents are examined on a nibble by nibble basis to determine if any of the nibbles in that segment match the value of the most frequently occurring nibble 146.

Now referring to FIGS. 32 and 33A, assume our stream of data is comprised of 100 segments, each containing 16 nibbles. Also assume that our most frequently occurring nibble value is 14 (i.e., binary 1110). Each segment is examined for the occurrence of the most frequently occurring nibble and for those segments which contain the most frequently occurring nibble value, a control bit CONT$ is set equal to one 148 (see segments 2, 3 and 100 in FIG. 33A). If a segment does not contain the most frequently occurring nibble value, the CONT$ value is set equal to zero (see segments 1 and 99 in FIG. 33A). Additionally, for each segment which does contain the most frequently occurring nibble value, the location of that nibble value within its string is logged in the POS$ variable and the most frequently occurring nibble value is removed from each segment. The "hole" which remains is filled by "left shifting" the right most nibbles within each segment 160. From Table 6, the POS$ value is addressed and the corresponding NFV$ value is logged (FIG. 33B). Next, a string is built TOTNPV$ of all MPV$ values and another string is built TOTCONT$ of all CONT$ values. In segments which the most frequently occurring nibble value does not occur, all 16 nibble values are mapped to range in value from zero to fourteen 152. This mapping allows us to apply a conventional packing routine using a base of 15 (for an example of a pack routine see the Definition Section).

TABLE 6

| Position (POS$) | Mapped Position Value (MPV$) | Position (POS$) | Mapped Position Value (MPV$) |
|---|---|---|---|
| 1 | 0000 | 9 | 0100 |
| 2 | 0010 | 10 | 0110 |
| 3 | 0001 | 11 | 0101 |
| 4 | 0011 | 12 | 0111 |
| 5 | 1000 | 13 | 1100 |
| 6 | 1010 | 14 | 1110 |
| 7 | 1001 | 15 | 1101 |
| 8 | 1011 | 16 | 1111 |

The savings achieved by distribution encode method are as follows:

A. In strings where the most frequently occurring nibble does not occur, we save approximately 1.488 bits for every 16 nibbles contained in that segment. For example, if we are working with segments which are 32 nibbles in length, packing will save us 2.976 bits.

B. In segments where the most frequently occurring nibble does occur, we avail ourselves of two different savings. Firstly, for all nibbles which occur prior to the position of the most frequently occurring nibble, we can pack these as explained above. By packing in this way, we save 0.093 of a bit for every nibble that occurs before our most frequently occurring nibble. The second source of savings is found in the way we have set up the mapped position values in Table 6. Because the most frequently occurring nibble values can occur more than once, when they do, they tend to occur in the lower half of the segment more often than they occur in the higher half of the segment. Taking advantage of this, we have zero biased our mapped position values (MPV$) to have a greater number of zeros in positions 1-8 than the zeros found in positions 9-16. If in fact this zero bias does occur, it will be reflected in our TOTMPV$ string making it a perfect candidate to send through convert/encrypt routine 98 for compression.

C. Yet a third source of savings is realized by sending the TOTCONT$ string through convert/encrypt 98. Given evenly distributed data, the most frequently occurring nibble values will occur in approximately 64.2 percent of the strings and will not occur in approximately 35.8 percent of the strings. This will be reflected in the bias of TOTCONT$ thus making it a perfect candidate for convert/encrypt routine 98.

Now referring to FIG. 34, after processing segments 1-100 using distribution compression 92, the resultant strings are concatenated according to the sequence set out in FIG. 34. Thus, at the time output string is to be decoded to reconstruct the original file, the decoding process is straight forward. Firstly, the MOD(TOTCONT$) string and the MOD(TOTMPV$) strings are decoded in the manner which has already been discussed in conjunction with decoding information processed by convert/encrypt routine 98. Next, from accessing each bit in TOTCONT$, we know the status of each packed block. If a block did not contain the most frequently occurring nibble value, we simply unpack its contents (for an example of the unpack operation see PACK ROUTINE in the Definition section). If a segment did contain the most frequently occurring nibble value, we unpack the bytes which occurred prior to the most frequently occurring nibble value. Wherein the unpacked portion is concatenated onto the remaining portion of the block. Distribution compression 92 can be used successively on a block of data in the same way nibble compression 90 was applied. In this way, both nibble compression 90 and distribution compression 92 are recursive and are effective for compressing the data each time they are applied thereto. Thus, even when only small reductions are possible, they can be magnified through recursion thereby generating greater gains than are normally possible when using "single pass" compression techniques. For example, even the removal of 0.093 of a bit results in a compression of 93.0K bits if achieved for 1 million recursion cycles.

Now referring to FIGS. 2 and 3B, thus, in this section, we have explained the operation of distribution compression 92 and how it works in conjunction with a pack routine and convert/encrypt routine 98 to compress data. The last of the three compression routine 70 will now be examined.

3. Direct Bit Compression

Now referring to FIG. 2, 3A, 3B, 3C, and 35, direct bit compression 94 operates in block 70 much like nibble compression 90 and distribution compression 92. Thus, it can be used recursively on the source file. Unlike nibble compression 90 and distribution compression 92 it does not use convert/encryption routine 98.

Direct bit compression uses a single algorithm to affect compression. This algorithm is the direct bit encode algorithm 95 which is most easily explained in conjunction with FIG. 35. The source file is read and eight bit words are parsed from the file. Depending on the value of each particular word, a predetermined value is subtracted from it yielding a balance value. Word values falling within case 1 are assigned a control word of 0, word values falling within case 2 are assigned a control word of 1, etc. Word values of zero (case 9) are assigned a control word of 10000001. As set out in FIG. 35, the number of encode bits plus control word bits equals 7 for cases 2-8 and 8 for case 1 and 9. Case 2-9 are assigned a resolve bit. Case 1 does not require a resolve bit. Thus, the far right hand column of FIG. 35 reflects that the number of encode bits plus control word bits plus resolve bit for each case is equal to 8 except for case 9 wherein the sum total is equal to 9.

Now referring to FIG. 35 and 36, in an example of applying direct bit encode method 95, assume that our input string is comprised of 5 bytes. BYTE1 through BYTE5. BYTES 1-5 contain the binary equivalent of the respective values set out in FIG. 36. BYTE1 having a word value of 32 is slotted in as a case 3 condition wherein the value of 32 is subtracted from it yielding a balance of 0, a control word of "11," and a resolve bit of 1. Similarly, the balance, control word, resolve bit for BYTES2, 3, and 4 are derived from FIG. 35. Next, balance output string (BOUTS$) is built by concatenating the balance words in order of EB1 through EB5. Thereafter output string CW/ROUTS$ is built by concatenating the control words of EB1 through EB5 in that order and thereafter concatentating the resolve bits of EB1 through EB5 in reverse order.

Figure 37:
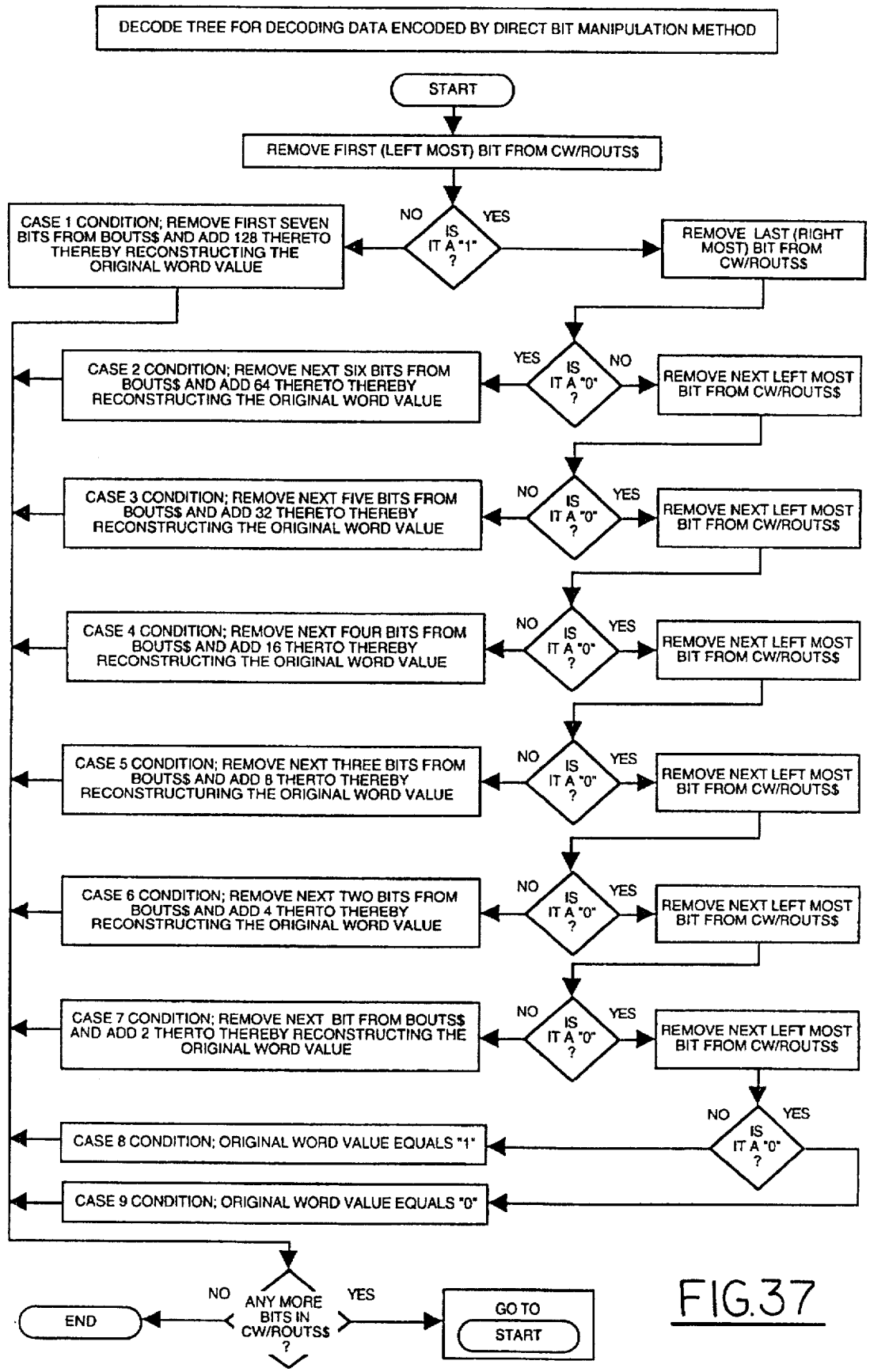
FIG. 37 is a decode tree for decoding data encoded by direct bit manipulation method.

Decoding (BOUTS$) and (CW/ROUTS$) to reconstruct the original string STRING$ is a matter of following the decode tree of FIG. 37. Note that for the last remaining string of CW/ROUTS$ and BOUTS$, the resolve bit is not needed for decode purposes. Thus, the final resolve bit (shown as EB4$(R) in the example of FIG. 36) can always be eliminated in CW/ROUTS$ without losing the ability to reconstruct the original word value. Thus, each time direct bit encode 95 recurses a file, it is guaranteed to shave off 1 bit—regardless of the entropy of the data in the file.

Figure 38A:
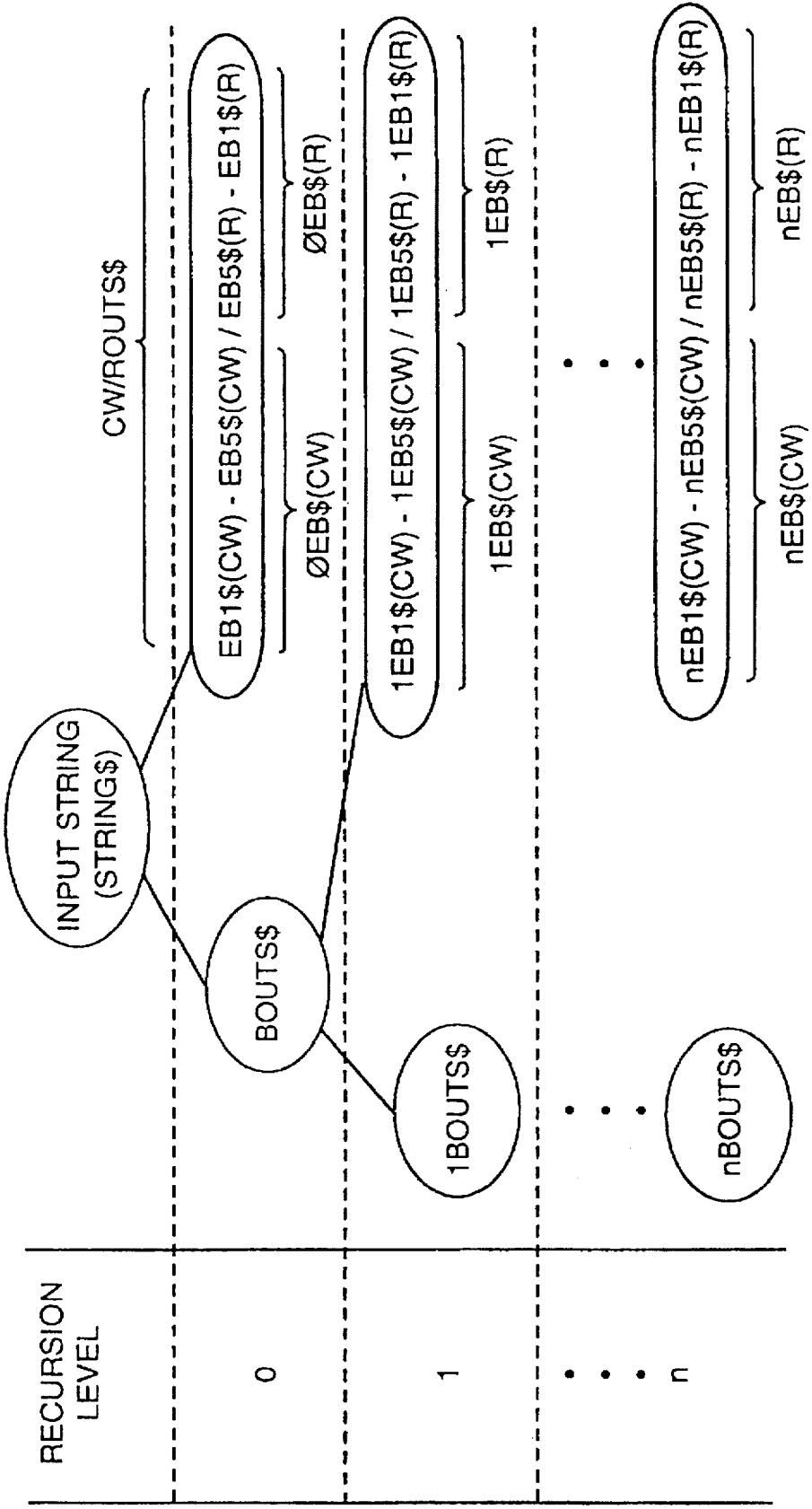

One method for applying direct bit encode recursively is shown in FIGS. 38A-38C. First, input string (STRING$) is operated on by direct bit encode method to create two output strings—BOUTS$ and CW/ROUTS$ (this is the result of the example set forth in FIG. 36 and forms the output of recursion level "0" as shown in FIG. 38A). In subsequent recursions, the BOUTS$ string is continually operated on by direct bit encode method thereby creating successive strings of EB$(CW) and EB$(R). This process is continued until the remaining BOUTS$ string is reduced to a predefined size (such as 32 bits). Next, the four strings of FIG. 38B are constructed as shown and concatenated together as set out in FIG. 38C. If further recursions are necessary, a second recursion counter can keep track of the number of times the string of 38C is fed back into the methodology of FIG. 38A. Thus, one skilled in the art can see that by keeping the appropriate counters, the direct bit encode method of the present invention is effective for reducing an input string by one bit regardless of the bit pattern of the input string. Although a certain amount of "loss" is necessary in keeping and maintaining various counters and registers, for files which are sufficiently large, this overhead is insignificant compared to the savings obtained by the direct bit encode method.

The only exception to the rule that direct bit encode 95 always shaves one bit from the input string, is if a incoming byte has a word value of zero. In this instance a case 9 condition is present wherein the encode bits plus control word bits plus resolve bit result in a string length of 9 bits. In this case, the combined length of CW/ROUTS$ and BOUTS$ will in fact grow by 1 bit. In order to eliminate this undesirable result we observe that in 1,024 bytes of evenly distributed data, there will on average be present four "0" bits resulting in a growth of 3 bits (4 bits gained by applying direct bit encode method minus 1 bit saved by eliminating the resolve bit on the last byte). However, by changing the work area from 1 byte to 2 bytes and encoding in the manner set out in FIG. 38, the likelihood of a "0" bit value occurring falls to 1 in 65,536. Likewise, if a word space of 3 byte words is chosen the likelihood of a "0" occurring falls to 1 in 16,777,216. Still further, if a work space of 4 byte words is selected, the likelihood of a "0" occurring is 1 in 4,294,967,296. Thus, by selected a large enough work space the chance of receiving a word value of "0" is extremely small. And even in the case where an occasional word value of "0" is received, the loss on that recursion is more than made up by subsequent recursions.

Having described the preferred embodiments of the compression methods of the present invention, it will be understood that various modifications or additions may be made to the preferred embodiments chosen here to illustrate the present invention, without departing from the spirit of the present invention. For example, many of the variables chosen herein to illustrate the compression methods were selected having specific lengths in mind (such as 1 bit, 1 nibble, 1 word, etc.). It will be understood, however, that these word sizes, in many instances, are flexible and could just as easily be altered without affecting the operation of the various algorithms at hand. Accordingly, it is to be understood that the subject matter sought to be afforded protection hereby shall be deemed to extend to the subject matter defined in the appended claims, including all fair equivalents thereof.

I claim:

1. A method of compressing data from a stream of electrically encoded binary data using a direct bit manipulation method, comprising the steps of:

A) dividing said stream of binary data into a plurality of input words;

B) defining a plurality of ranges;

C) determining the range in which each of the words fall;

D) for each determination made in step C, converting each word into a balance value and assigning a control word and a resolve word to each said balance value, wherein the balance value, control word, and resolve word uniquely define the value of their associated input word.

2. The method of claim 1, wherien the balance value is calculated by subtracting one of said words in said plurality of input words by its associated range.

3. The method of claim 1, further including the steps of:

(E) building a first string by converting the balance values into corresponding balance strings and concatenating said balance strings together, and (F) building a second string by converting said control words into corresponding control word strings and concatenating said control word strings together.

4. The method of claim 3, further including the steps of:

(G) building a third string by concatenating resolve words together, and (H) buidling a fourth string by concatenating the string of step (G) with the string of step (F).

* * * * *